US010601106B2

(12) United States Patent
Ito et al.

(10) Patent No.: US 10,601,106 B2
(45) Date of Patent: Mar. 24, 2020

(54) WIRELESS MODULE AND METHOD FOR MANUFACTURING THE SAME

(71) Applicant: TAIYO YUDEN CO., LTD., Tokyo (JP)

(72) Inventors: Taiji Ito, Tokyo (JP); Jin Mikata, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 115 days.

(21) Appl. No.: 15/832,405

(22) Filed: Dec. 5, 2017

(65) Prior Publication Data

US 2018/0166767 A1  Jun. 14, 2018

(30) Foreign Application Priority Data

Dec. 9, 2016  (JP) ................ 2016-239086

(51) Int. Cl.
*H01Q 1/22* (2006.01)
*H01Q 1/24* (2006.01)
(Continued)

(52) U.S. Cl.
CPC ........... *H01Q 1/2283* (2013.01); *H01L 23/66* (2013.01); *H01L 25/00* (2013.01); *H01Q 1/243* (2013.01);
(Continued)

(58) Field of Classification Search
CPC .. H01Q 1/2283; H01Q 1/2258; H01Q 1/1207; H01Q 1/243; H01Q 1/38; H01Q 23/00
See application file for complete search history.

(56) References Cited

U.S. PATENT DOCUMENTS

2016/0149300 A1  5/2016  Ito et al.
2018/0261566 A1*  9/2018  Babcock ................. H01L 24/73

FOREIGN PATENT DOCUMENTS

JP  H11-354689 A  12/1999
JP  2006-173256 A  6/2006
(Continued)

OTHER PUBLICATIONS

Japanese Office Action dated Oct. 16, 2018, in a counterpart Japanese patent application No. 2016-239086. (A machine translation (not reviewed for accuracy) attached.).
(Continued)

*Primary Examiner* — Hoang V Nguyen
(74) *Attorney, Agent, or Firm* — Chen Yoshimura LLP

(57) ABSTRACT

A wireless module includes: a rectangular shaped substrate; an antenna element provided in a first region of the substrate; a rectangular shaped integrated circuit element provided in a second region of the substrate, the integrated circuit element including, in a single package, an RF unit to process an RF signal, a baseband unit to process a baseband signal, and a power supply unit; and discrete components provided in a third region of the substrate, the integrated circuit element provided such that two parallel sides of the integrated circuit element are along long sides of the substrate, neither the first region nor the third region being provided between each long side of the substrate and each side of the integrated circuit element along the long side, the first region and the third region being provided to be aligned in a longitudinal direction of the substrate with respect to the second region.

8 Claims, 27 Drawing Sheets

(51) Int. Cl.
   *H01Q 23/00*      (2006.01)
   *H01L 25/00*      (2006.01)
   *H01L 23/66*      (2006.01)
   *H04B 1/38*       (2015.01)
   *H01Q 1/38*       (2006.01)
   *H01Q 1/12*       (2006.01)

(52) U.S. Cl.
   CPC ............... *H01Q 1/38* (2013.01); *H01Q 23/00* (2013.01); *H04B 1/38* (2013.01); *H01Q 1/1207* (2013.01); *H01Q 1/2258* (2013.01)

(56)              References Cited

FOREIGN PATENT DOCUMENTS

| | | |
|---|---|---|
| JP | 2006-197143 A | 7/2006 |
| JP | 2008-098898 A | 4/2008 |
| JP | 2013-171980 A | 9/2013 |
| JP | 2013-179152 A | 9/2013 |
| WO | 2013/115158 A1 | 8/2013 |
| WO | 2014/112243 A1 | 7/2014 |
| WO | 2015/001820 A1 | 1/2015 |
| WO | 2015/015863 A1 | 3/2017 |

OTHER PUBLICATIONS

Japanese Office Action dated Oct. 11, 2019, in a counterpart Japanese patent application No. 2019-004945. (A machine translation (not reviewed for accuracy) attached.).

* cited by examiner

WIRELESS MODULE AND METHOD FOR MANUFACTURING THE SAME

CROSS-REFERENCE TO RELATED APPLICATION

This application claims the benefit of priority to Japanese Patent Application No. 2016-239086, filed Dec. 9, 2016, of which full contents are incorporated herein by reference.

BACKGROUND

Technical Fields

The present disclosure relates to a wireless module and a method for manufacturing the wireless module.

Background

Ultra-small wireless modules have been developed in recent years, each of which is configured such that an electronic component and an antenna capable of transmitting/receiving radio waves are mounted on a single substrate. Such wireless modules are incorporated in various electronic devices including wearable devices (for example, see International Publication No. 2015/015863).

Many of the electronic devices including such wireless modules have an elongate shape, such as glasses frames, an electronic pen, and an automatic tooth brush.

Accordingly, miniaturization of wireless modules, specifically, slimming down is strongly demanded. Furthermore, weight reduction is also required, and thus implementation of thorough slimming down without wasted space is desired.

SUMMARY

A primary aspect of the disclosure for achieving advantages described above is a wireless module comprising: a substrate having a rectangular shape; an antenna element provided in a first region of the substrate; an integrated circuit element having a rectangular shape provided in a second region of the substrate, the integrated circuit element including an RF unit, a baseband unit, and a power supply unit, in a single package, the RF unit being configured to process an RF signal, the baseband unit being configured to process a baseband signal; and a plurality of discrete components provided in a third region of the substrate, the integrated circuit element being provided in the second region such that two parallel sides of the integrated circuit element are along long sides of the substrate, neither of the first region and the third region being provided between each of the two long sides of the substrate and each of the two sides of the integrated circuit element, the first region and the third region being provided along a longitudinal direction of the substrate with respect to the second region.

Other features of the present invention will become apparent from descriptions of the present specification and of the accompanying drawings.

DETAILED DESCRIPTION

Figure 1:
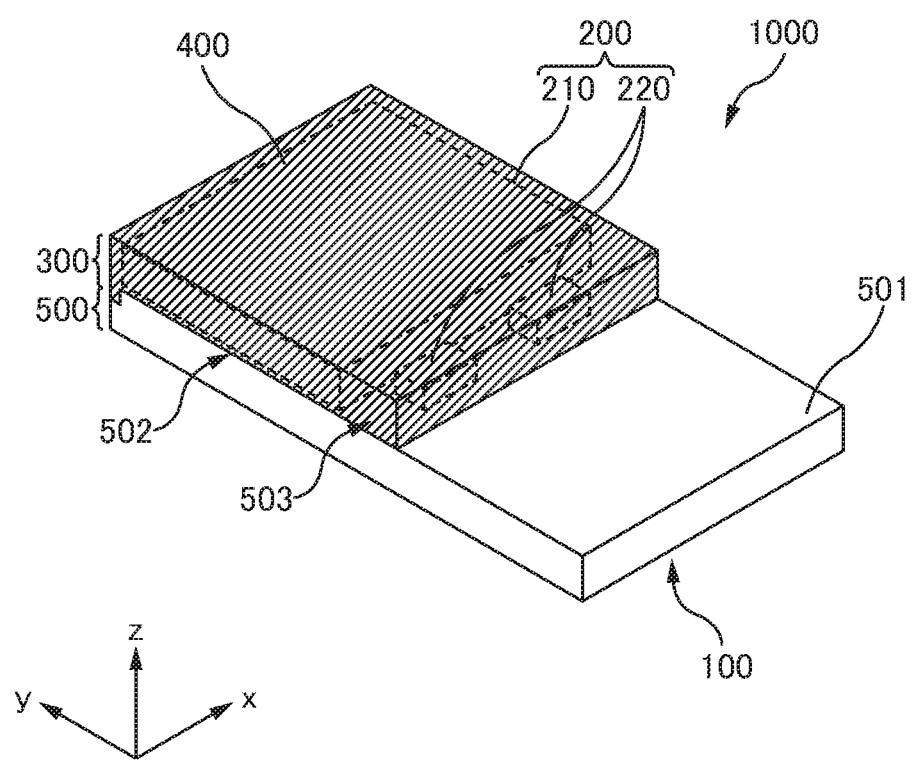
FIG. 1 is an external perspective view illustrating a wireless module according to an embodiment of the present disclosure.

A wireless module and a method for manufacturing the wireless module according to an embodiment of the present disclosure will be described hereinafter with reference to the drawings as appropriate. Throughout the drawings, the same components are denoted by the same reference numerals. As used herein, the singular forms "a", "an", and "the" are intended to include the plural forms as well, unless the context clearly indicates otherwise.

First Embodiment

==Wireless Module==

Figure 2:
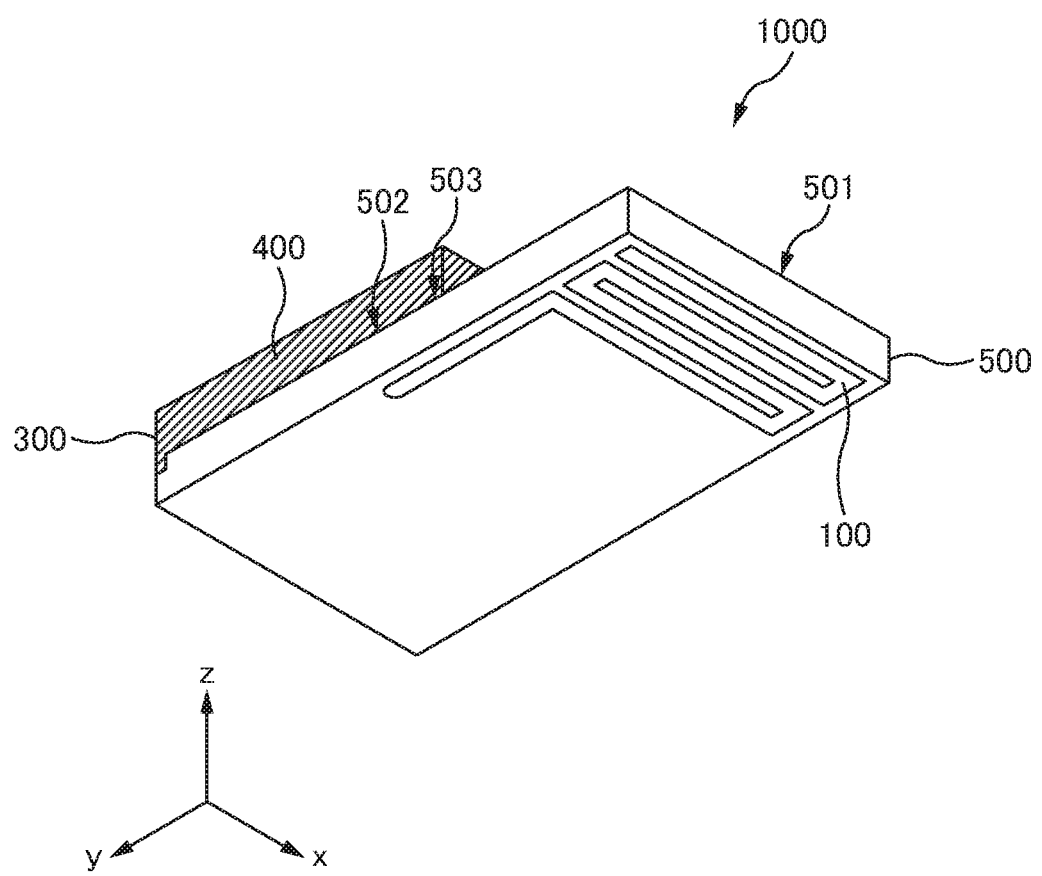
FIG. 2 is an external perspective view illustrating a wireless module according to an embodiment of the present disclosure.
Figure 3:
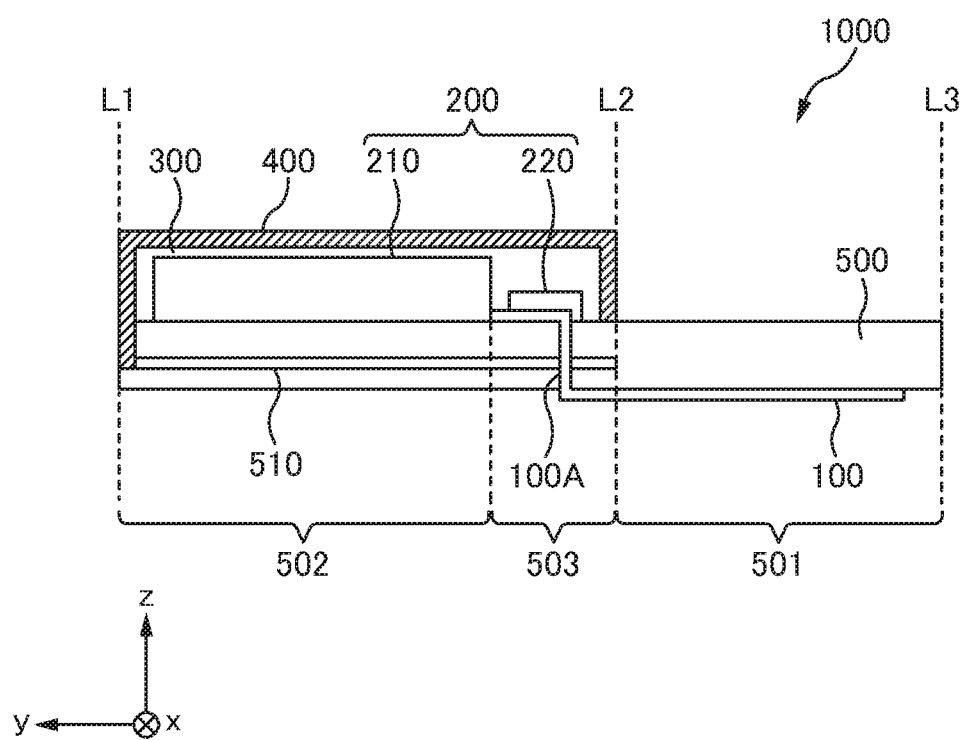
FIG. 3 is a cross-sectional view illustrating a wireless module according to an embodiment of the present disclosure.
Figure 4:
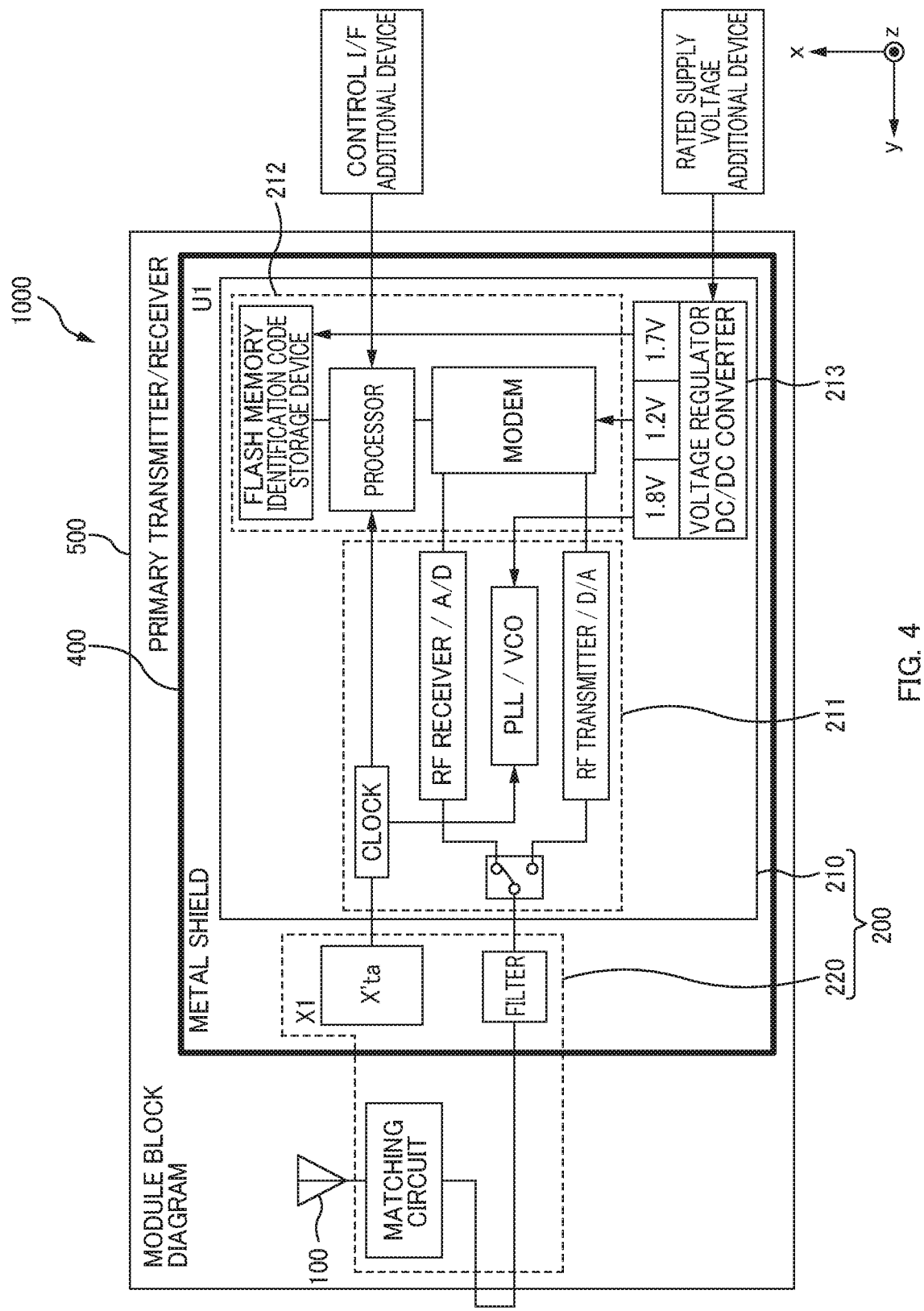
FIG. 4 is a functional block diagram illustrating a wireless module according to an embodiment of the present disclosure.

FIGS. 1 to 4 illustrate a wireless module 1000 according to an embodiment of the present disclosure. FIGS. 1 and 2 are external perspective views illustrating the wireless module 1000, and FIG. 3 is a cross-sectional view illustrating the wireless module 1000. FIG. 4 is a functional block diagram illustrating the wireless module 1000.

As illustrated in FIGS. 1 and 2, the wireless module 1000 has a substantially rectangular shape. Then, in an embodiment of the present disclosure, a longitudinal direction of the wireless module 1000 is referred to as a y-axis direction, a lateral direction thereof is referred to as an x-axis direction, and a thickness direction thereof is referred to as a z-axis direction.

The wireless module 1000 comprises a substrate 500, an electronic component 200, an antenna (antenna element) 100, a resin layer 300, and a shielding layer 400.

The substrate 500 is, as illustrated in FIG. 3, a multi-layer substrate in which a ground layer 510 configured to supply a ground potential to the electronic component 200 is formed inside the substrate. Further, the substrate 500 is a substantially rectangular board having four sides along the x-axis direction and the y-axis direction, and has a thickness (width in the z-axis direction) equal to or smaller than 1 mm (millimeter), for example, about 0.3 m.

The ground layer 510 is a conductive pattern formed in a planar manner along a face of the substrate 500.

Further, in the substrate 500, as illustrated in FIG. 3, an antenna region (first region) 501, an integrated circuit region (second region) 502 and a discrete component region (third region) 503, which will be described later, are provided so as to be aligned in the y-axis direction without overlapping with one another.

The electronic component 200 comprises: a rectangular integrated circuit (integrated circuit element) 210 configured such that a semiconductor chip is sealed with a package made of resin or ceramic such as an Integrated Circuit (IC) and a Large Scale Integrated circuit (LSI); and various discrete components 220 such as a resistor and a capacitor, and the electronic component 200 are mounted to a front surface (one face) of the substrate 500. In one embodiment of the present disclosure, the single integrated circuit 210 and the plurality of discrete components 220 are mounted to the front surface of the substrate 500.

The integrated circuit 210, as illustrated in FIG. 4, comprises an RF unit 211 configured to process an RF signal, a baseband unit 212 configured to process a baseband signal, and a power supply unit 213, and is configured such that these units are integrated in a single package. The integrated circuit 210 is mounted to the substrate 500 such that the long sides of the integrated circuit 210 are along the long sides of the substrate 500 (y-axis direction), while the short sides of the integrated circuit 210 are along the short sides of the substrate 500 (x-axis direction).

The discrete components 220 include various discrete components, for example, a filtering element and a passive element, such as a resistor, a capacitor, or a coil, for matching sensitivity of the antenna 100, and an oscillator for supplying a pulse signal to the integrated circuit 210.

In the electronic component 200, these integrated circuit 210 and discrete components 220 constitute an oscillator circuit, and radio waves are transmitted or received using the antenna 100 which will be described below. Note that, here, the description that radio waves are transmitted or received with the antenna 100 includes not only a case where the antenna 100 performs only either one of transmission and reception of radio waves, but also a case where the antenna 100 can perform both transmission and reception.

As illustrated in FIGS. 1 to 3, in an embodiment of the present disclosure, the antenna 100 is provided in the antenna region (first region) 501 of a back surface (the other face) of the substrate 500, the integrated circuit 210 is provided in the integrated circuit region (second region) 502 of the front surface (one face) of the substrate 500, and the discrete components 220 is provided in the discrete component region (third region) 503 of the front surface of the substrate 500. It is a matter of course that the antenna 100 may be provided to the front surface or an inner layer of the substrate 500.

As described above, the antenna region 501, the integrated circuit region 502 and the discrete component region 503 are provided to the substrate 500 so as to be aligned in the y-axis direction.

Note that the antenna 100 according to an embodiment of the present disclosure is a pattern antenna constituted by a conductive pattern formed on the substrate 500, but may be a chip antenna mounted to the substrate 500.

Further, as illustrated in FIG. 3, the electronic component 200 and the antenna 100 are electrically connected using an antenna connection portion 100A. The antenna connection portion 100A includes a via or a through hole and a conductive pattern that are formed in the substrate 500. The conductive pattern includes wiring, an electrode connected to the end part of this wiring, a pad, etc.

In the case where the antenna 100 is formed on the back surface of the substrate 500, noise radiated from the integrated circuit 210, which is a noise source in the electronic component 200, needs to pass through the resin and various conductive patterns constituting the substrate 500, to reach the antenna 100 on the back side of the substrate 500. This can causes the noise radiated from the integrated circuit 210 to less easily reach the antenna 100.

Back to FIG. 1, the resin layer 300 is formed in the integrated circuit region 502 and the discrete component region 503 to seal the electronic component 200. The resin layer 300 is constituted by a thermosetting resin such as an epoxy resin, or a UV-curable resin. A method for forming the resin layer 300 will be described later.

The shielding layer 400 is formed such that a conductive paste having conductivity, in which powder of metal, e.g., gold, silver, and nickel, is highly dispersed in a thermosetting resin or a UV-curable resin, is applied to the surface of the resin layer 300 and then cured. In an embodiment of the present disclosure, a silver paste is used as an exampl.

Accordingly, a configuration is made such that the electronic component 200 is sealed with the resin layer 300, and thereafter the surface of the resin layer 300 is covered with the shielding layer 400 having conductivity. Thus, it becomes possible to reduce leakage of noise caused by the electronic component 200 without using a metal case. Further, since a metal case becomes unnecessary, the wireless module 1000 can be downsized.

Note that the shielding layer 400 may be formed at a location, as long as where leakage of noise caused by the electronic component 200 can be minimized, in the surface of the resin layer 300. In the wireless module 1000 according to an embodiment of the present disclosure, as illustrated in FIG. 1, the shielding layer 400 is formed so as to cover the entire surface of the resin layer 300. With such an embodiment, leakage of noise from the electronic component 200 can be more reliably minimized, and the performance of the antenna 100 can be further enhanced.

Further, as illustrated in FIG. 3, the wireless module 1000 according to an embodiment of the present disclosure is formed such that the shielding layer 400 is electrically connected to the ground layer 510 provided inside the substrate 500 at an end face of the wireless module 1000 depicted by L1. With such an embodiment, the shielding layer 400 is not required to be grounded using other means such as a wire, thereby being able to simplify the configuration of the wireless module 1000, and reduction in the number of components can lower the failure rate of the wireless module 1000, which can enhance reliability.

Note that L1 indicates one end face of the wireless module 1000, while L3 indicates the other end face of the wireless module 1000. Then, L2 indicates a boundary between the antenna region 501 and the discrete component region 503.

==Method for Manufacturing Wireless Module==

Next, a method for manufacturing the wireless module 1000 according to an embodiment of the present disclosure will be described with reference to FIGS. 5A to 5H.

Note that the wireless module 1000 according to an embodiment of the present disclosure is manufactured such that a plurality of the wireless module 1000 is integrally formed, and thereafter divided into individual pieces. Broken lines C1, C2 in the drawings indicate cutting lines (positions) when dividing the wireless module 1000 into individual pieces.

Figure 5A:
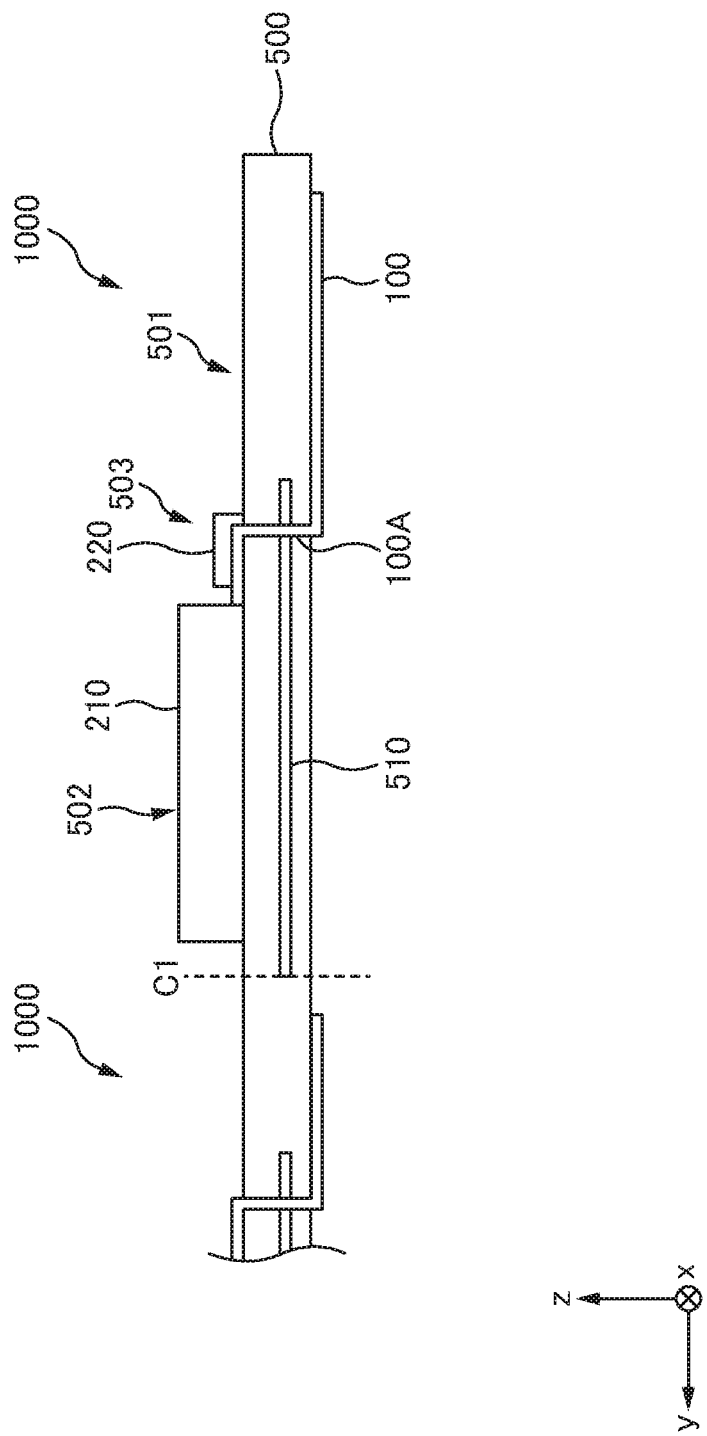
FIG. 5A is a diagram illustrating a method for manufacturing a wireless module according to an embodiment of the present disclosure.
Figure 5B:
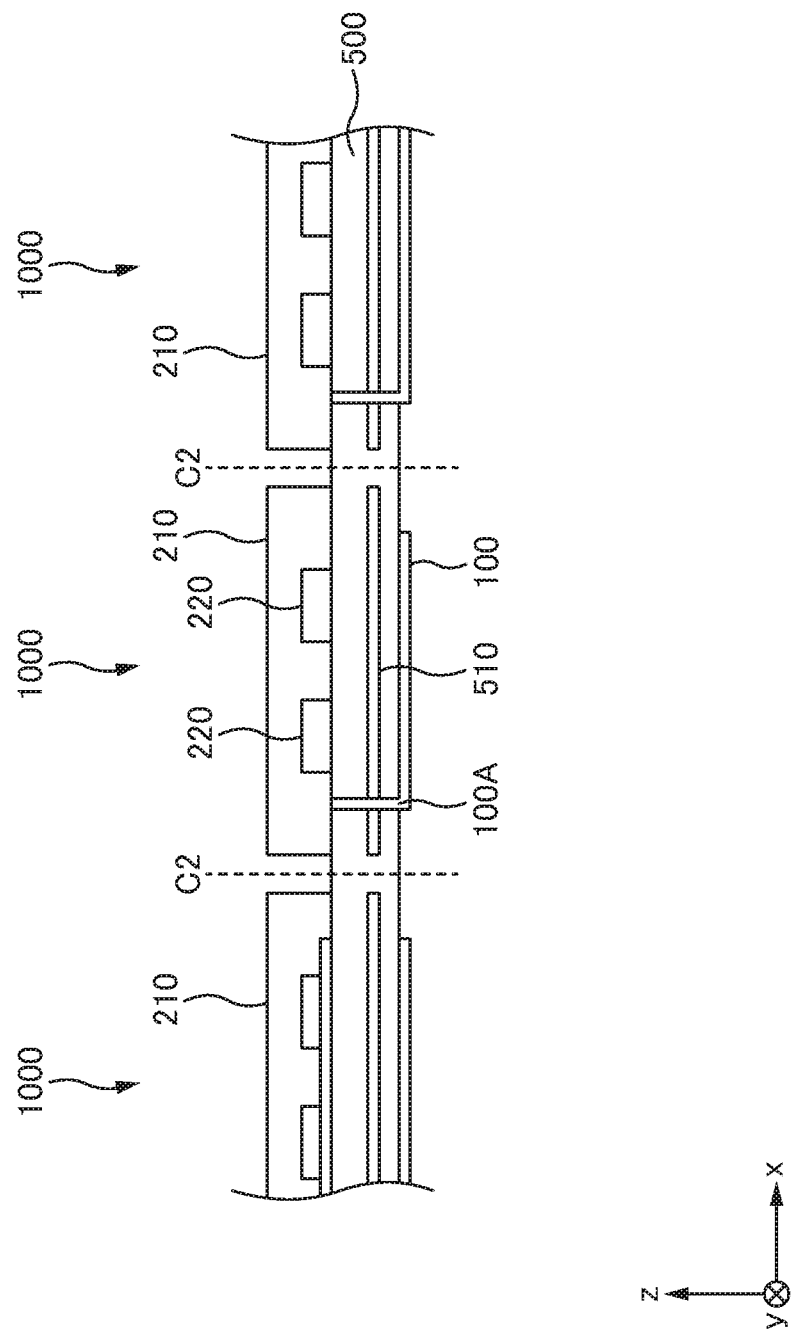
FIG. 5B is a diagram illustrating a method for manufacturing a wireless module according to an embodiment of the present disclosure.

First, as illustrated in FIGS. 5A and 5B, a conductive pattern that acts as the antenna 100 is formed on the substrate 500 (antenna forming process). In this antenna forming process, similarly to a common substrate manufacturing process, wiring pattern formation is performed by resist printing, etching, exposure, plating, formation of a through hole/via, and the like, to form a conductive pattern that acts as the antenna 100. In an embodiment of the present disclosure, the antenna 100 is formed in the antenna region 501 on the back surface of the substrate 500.

Further, concurrently with the antenna forming process, a first antenna connection portion 100A and the ground layer 510 inside the substrate 500 are also formed other than the antenna 100. At this occasion, the ground layer 510 is formed, as illustrated in FIG. 5A, such that when the substrate 500 is cut at the cutting line C1, the ground layer 510 is exposed on a cutting surface.

Next, as illustrated in FIGS. 5A and 5B, one integrated circuit 210 is mounted in the integrated circuit region (second region) 502 on the front surface of the substrate 500 (integrated circuit mounting process). The integrated circuit 210 is mounted to the substrate 500 such that two parallel long sides of the integrated circuit 210 are along the long sides of the substrate 500.

Further, at this time, the plurality of discrete components 220 are mounted in the discrete component region (third region) 503 of the front surface of the substrate 500 (discrete component mounting process). The discrete components 220 are mounted in the discrete component region 503 sandwiched between the antenna region 501 and the integrated circuit region 502 of the substrate 500, and are not mounted in a region between each of the two long sides of the integrated circuit 210 and each of the two long sides of the substrate 500.

Note that, as illustrated in FIG. 5A, the integrated circuit region 502 and the discrete component region 503 are provided so as to be aligned together with the antenna region 501 in the longitudinal direction (y-axis direction) of the substrate 500. Further, the discrete component region 503 is provided so as to be sandwiched between the antenna region 501 and the integrated circuit region 502.

Figure 5C:
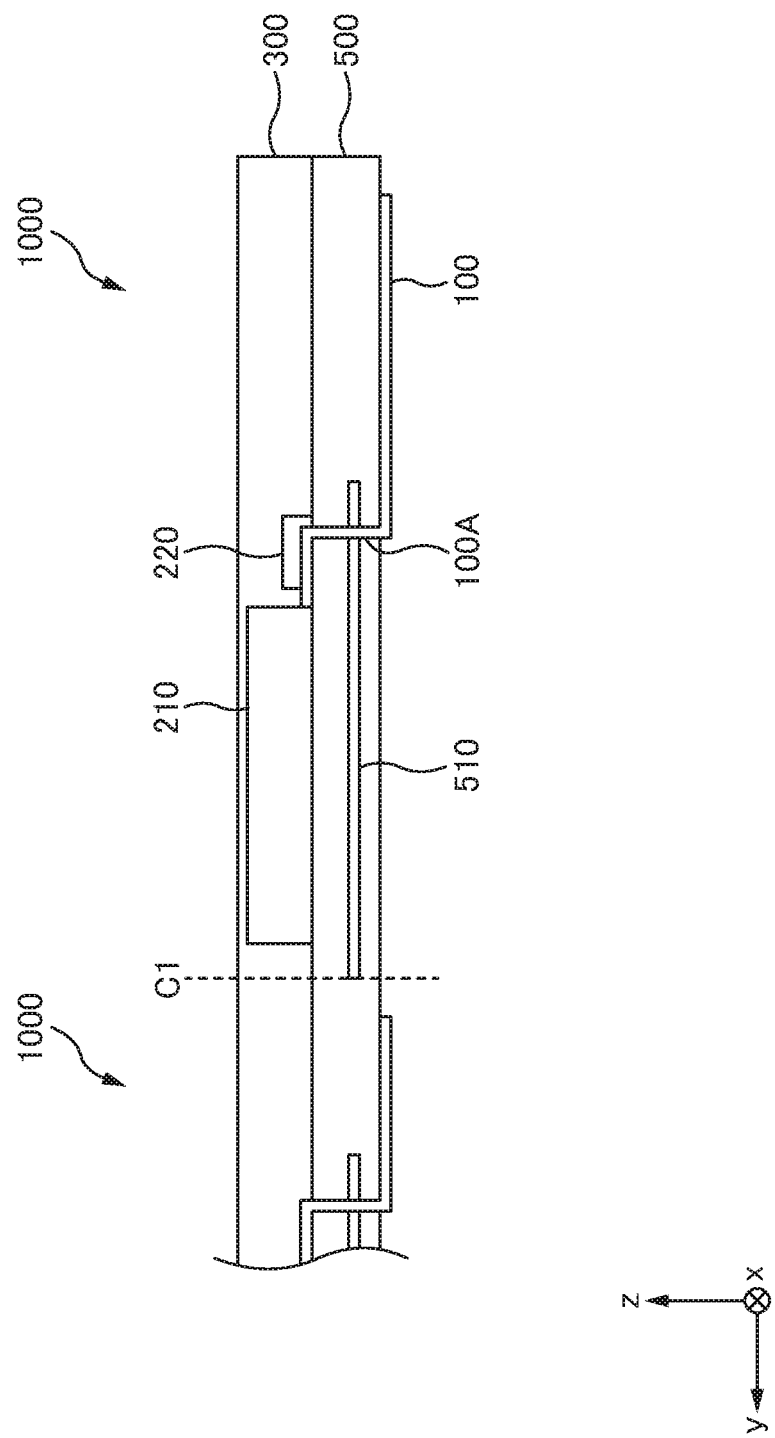
FIG. 5C is a diagram illustrating a method for manufacturing a wireless module according to an embodiment of the present disclosure.

Next, as illustrated in FIG. 5C, the entire front surface of the substrate 500 is covered with a resin, to form the resin layer 300 (resin layer forming process). The resin layer 300 is formed such that a thermosetting resin or a UV-curable resin is applied to the front surfaces of the substrate 500 and then cured. Accordingly, the electronic component 200 is sealed within the resin layer 300.

Figure 5D:
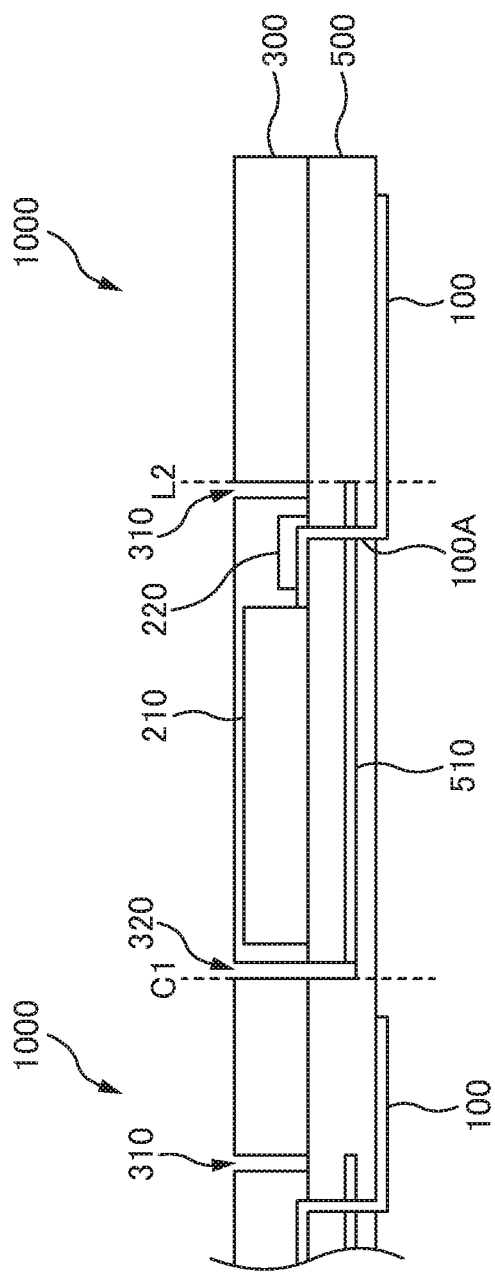
FIG. 5D is a diagram illustrating a method for manufacturing a wireless module according to an embodiment of the present disclosure.
Figure 5E:
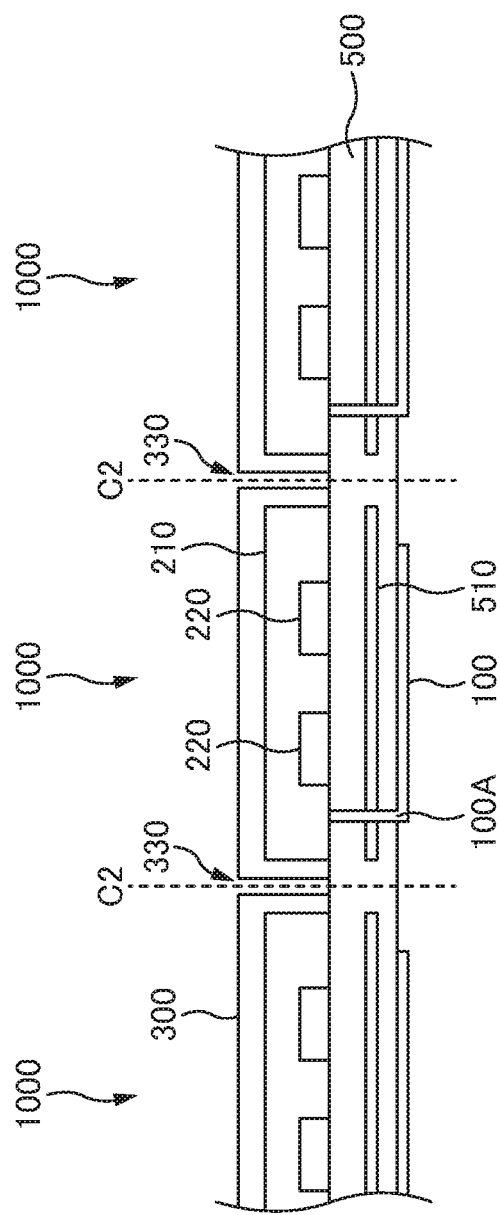
FIG. 5E is a diagram illustrating a method for manufacturing a wireless module according to an embodiment of the present disclosure.

Thereafter, as illustrated in FIG. 5D, a groove 310 having a predetermined depth is formed in the resin layer 300 along the boundary L2 between the antenna region 501 and the discrete component region 503 (groove forming process). Further, similarly, a groove 320 having such a depth as to reach the ground layer 510 of the substrate 500 is formed along the cutting line C1. Furthermore, as illustrated in FIG. 5E, grooves 330 are formed along cutting lines C2.

Figure 5F:
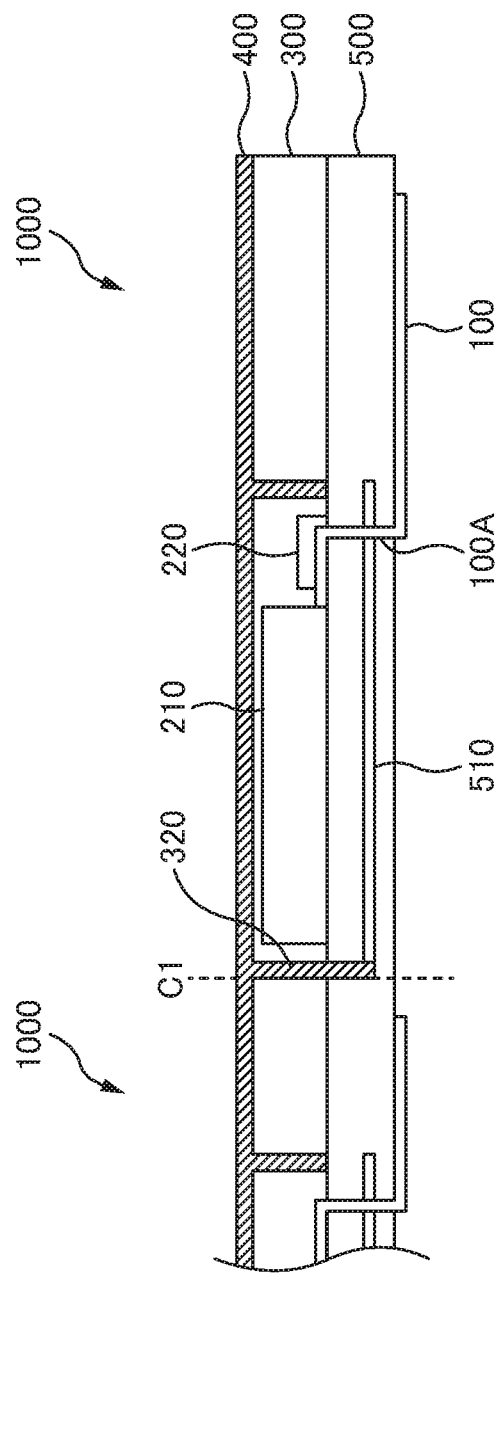
FIG. 5F is a diagram illustrating a method for manufacturing a wireless module according to an embodiment of the present disclosure.

Then, as illustrated in FIG. 5F, a silver paste is applied to the surface of the resin layer 300 including the insides of the grooves 310, 320, 330 and cured, thereby forming the shielding layer 400 (shielding layer forming process).

At this occasion, the shielding layer 400 formed inside the groove 320 is electrically connected to the ground layer 510 provided inside the substrate 500.

Figure 5G:
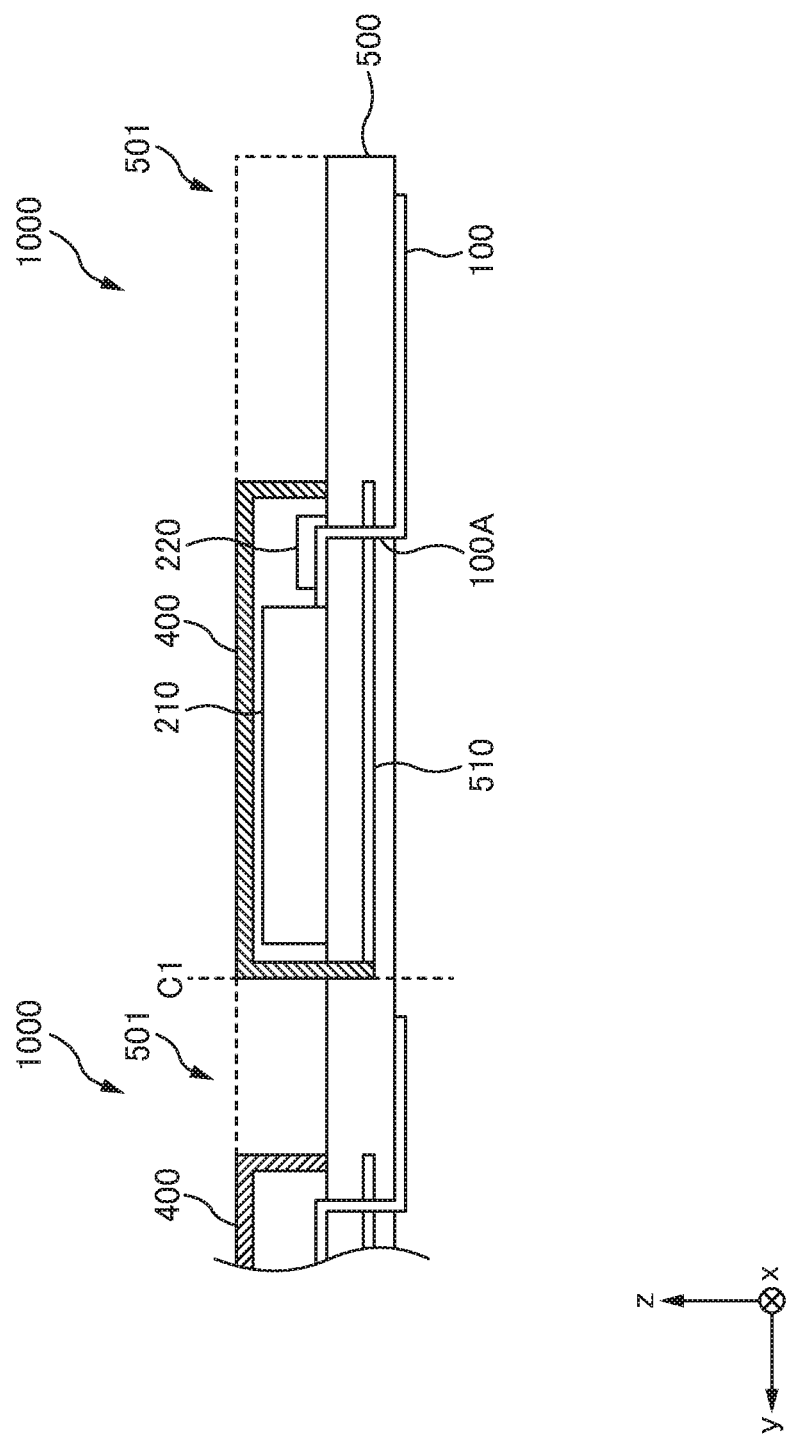
FIG. 5G is a diagram illustrating a method for manufacturing a wireless module according to an embodiment of the present disclosure.

Thereafter, as illustrated in FIG. 5G, the resin layer 300 and the shielding layer 400 formed in the antenna region 501, in the resin layer 300 and the shielding layer 400 formed on the entire front surface of the substrate 500, are removed by performing a cutting process using a drill, etc., (removing process).

According to such an embodiment, the resin layer 300 and the shielding layer 400 can be formed in the integrated circuit region 502 and the discrete component region 503. Further, the shielding layer 400 disappears from a portion corresponding to the antenna region 501 of the wireless module 1000, and thus the radio waves transmitted or received by the antenna 100 formed in the antenna region 501 is not interfered with by the shielding layer 400. This can enhance transmission sensitivity and reception sensitivity of the antenna 100.

Further, the shielding layer 400 formed, on the inner surface on the antenna region 501 side, in the inner surfaces of the groove 310, is removed during a cutting process, however, the shielding layer 400 formed on the inner surface on the discrete component region 503 side is left without being cut off. Accordingly, the surfaces of the resin layer 300 (top surface and four side surfaces) left in the integrated circuit region 502 and the discrete component region 503 can be covered with the shielding layer 400.

Thereafter, the substrate 500 is cut at the cutting lines C1, C2 and the wireless modules 1000 are divided into individual pieces, to finish the wireless module 1000 according to an embodiment of the present disclosure illustrated in FIGS. 1 to 4 (substrate cutting process).

Figure 5H:
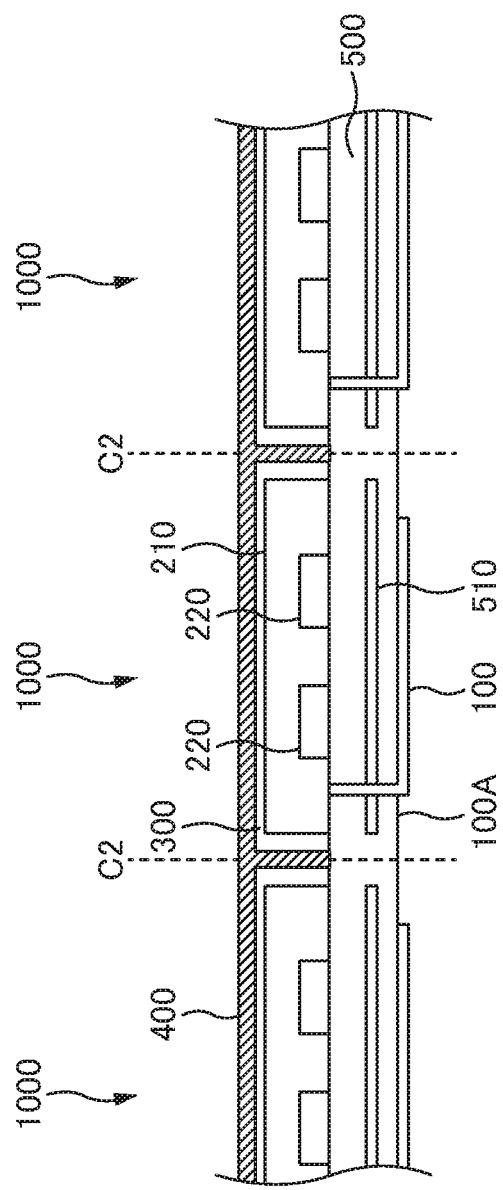
FIG. 5H is a diagram illustrating a method for manufacturing a wireless module according to an embodiment of the present disclosure.

FIG. 5H illustrates the substrate 500 being cut at the cutting lines C2. At this time, as illustrated in FIG. 5H, the substrate 500 is cut along the long sides (sides in the y-axis direction) of the integrated circuit 210 (i.e., at the cutting lines C2) such that the length of the short sides of the substrate 500 (sides in the x-axis direction) become substantially equal to the length of the short sides of the integrated circuit 210 (i.e., the length substantially equal to the interval of the two long sides of the integrated circuit 210). That is, a length obtained by adding the thickness of the resin layer 300 (thickness in the x-axis direction) and the thickness of the shielding layer 400 (thickness in the x-axis direction) to the length of the short sides of the integrated circuit 210 becomes substantially equal to the length of the short sides of the substrate 500.

Figure 6:
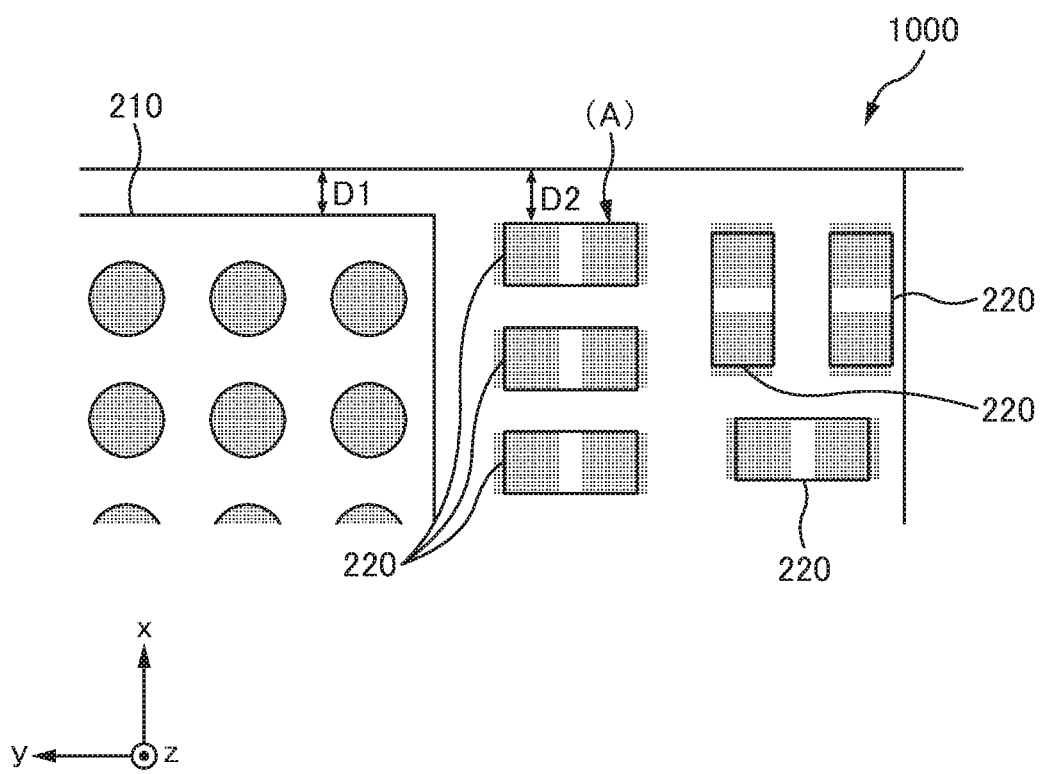
FIG. 6 is a diagram illustrating an arrangement of an integrated circuit element and an electronic component in a wireless module according to an embodiment of the present disclosure.

At this time, as illustrated in FIG. 6, a distance (D1) between each long side of the substrate 500 (each side in the y-axis direction) and each long side of the integrated circuit 210 (each side in the y-axis direction) is set to be equal to or greater than 0.1 mm and equal to and smaller than 0.5 mm. According to such an embodiment, the length in the lateral direction (x-axis direction) of the substrate 500 can be made closer to the length of the short sides of the integrated circuit 210 to the utmost limit. Thus, the wireless module 1000 can be downsized.

Alternately, by virtue of improvement of work accuracy during manufacturing and tightening of allowable variations of finished products, if the distance D1 is set to be equal to or greater than 0.10 mm and equal to and smaller than 0.20 mm, the wireless module 1000 can be more downsized, which is more preferable.

Further, as illustrated in FIG. 6, it is more preferable that the discrete components 220 are mounted to the substrate 500 such that a distance (depicted by D2 in FIG. 6) between the discrete component 220 (depicted by (A) in FIG. 6) closest to the long side of the substrate 500 in the plurality of discrete components 220 mounted to the substrate 500 and the long side of the substrate 500 becomes equal to or greater than a distance (depicted by D1 in FIG. 6) between the long side of the integrated circuit 210 and the long side of the substrate 500 (D2≥D1).

Commonly, the external dimensions of the discrete components 220 vary more widely than the external dimensions of the integrated circuit 210. For example, the external dimensions of a WLCSP, which is an example of the integrated circuit 210, have a tolerance of plus or minus 0.05 mm (millimeter), while the external dimensions of a chip capacitor, which is an example of the discrete components 220, have a tolerance of plus or minus 0.1 mm.

Thus, in a process for manufacturing the wireless module 1000, if D2 is set to a value smaller than D1, the discrete component 220, such as a chip capacitor, might be closer to the long side of the substrate 500 than the integrated circuit 210, such as a WLCSP.

In such a case, when the substrate 500 is cut along the cutting lines C2 in the substrate cutting process, the cutting lines C2 of the substrate 500 need to be disposed away from the discrete components 220 so that the discrete components 220 are not cut. As a result, the short sides of the wireless module 1000 result in inevitably being long.

Further, when the integrated circuit 210 and the discrete components 220 are soldered to the substrate 500, commonly, solder leaks outward more easily in the discrete components 220 than in the integrated circuit 210.

Accordingly, in the process of manufacturing the wireless module 1000, if D2 is set to a value smaller than D1, the solder having leaked outward from the discrete components 220 results in being closer to the cutting line C2 than the solder having leaked outward from the integrated circuit 210.

Thus, as in an embodiment of the present disclosure, the discrete components 220 are mounted to the substrate 500 so that D2≥D1 is satisfied. This can bring the cutting lines C2 in the substrate 500 closer to the integrated circuit 210, thereby being able to reduce the length of the short sides of the wireless module 1000. Accordingly, the wireless module can be downsized.

Other Embodiments

The wireless module 1000 according to an embodiment of the present disclosure is able to have various embodiments other than an embodiment described above. FIGS. 7A to 7F illustrate examples of various embodiments of the wireless module 1000.

Figure 7A:
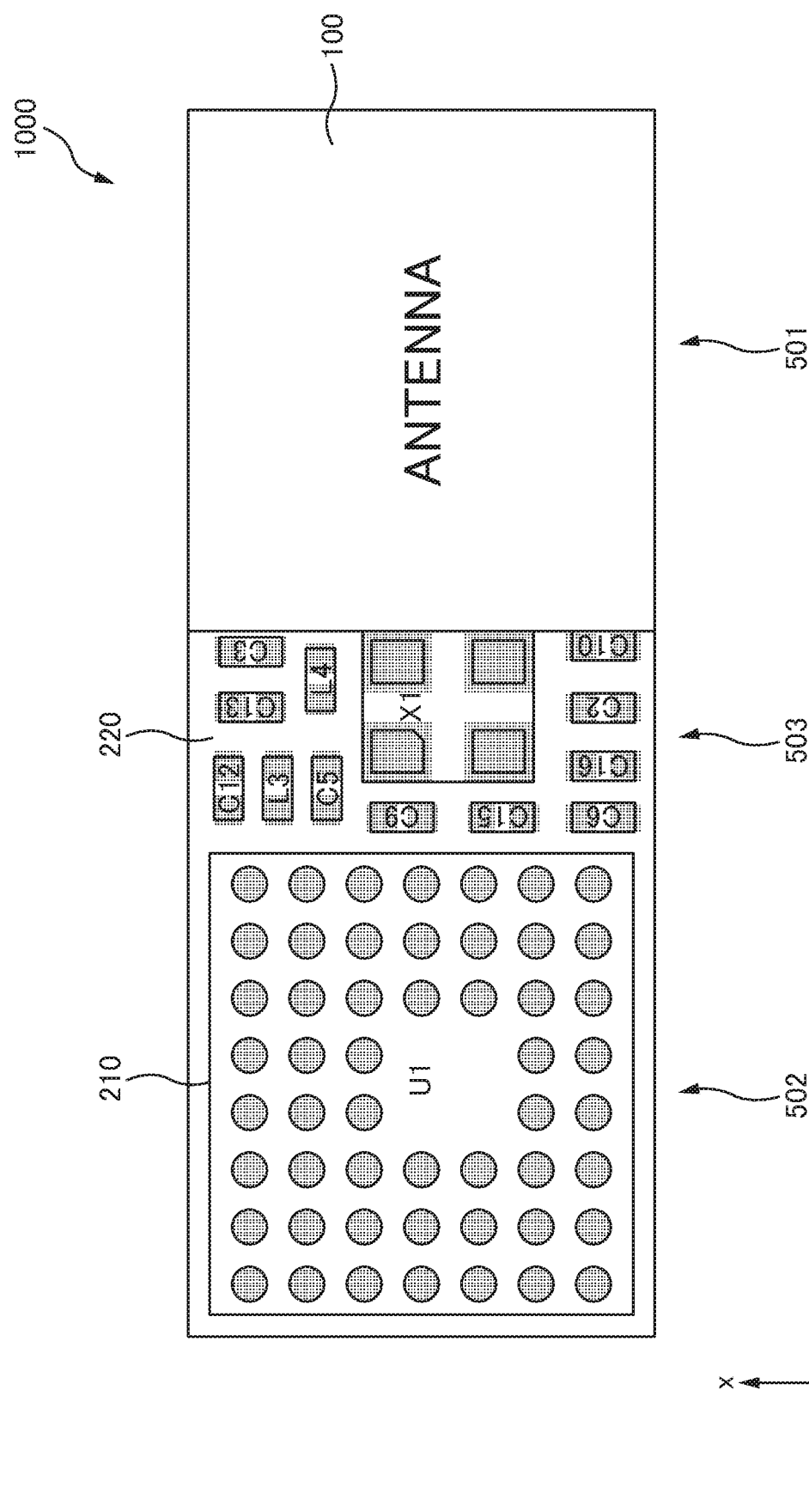
FIG. 7A is a diagram illustrating a wireless module according to an embodiment of the present disclosure.

The wireless module 1000 illustrated in FIG. 7A is an example in a case where all the discrete components 220 are mounted in the discrete component region 503, which is provided at a position sandwiched between the antenna region 501 where the antenna 100 is provided and the integrated circuit region 502 where the integrated circuit 210 is provided. The wireless module 1000 illustrated in FIG. 7A is the same as the wireless module 1000 illustrated in the first embodiment.

According to such an embodiment, an arrangement can be made such that the antenna 100 and the integrated circuit 210 are positioned away from each other, under such constraints that the substrate 500 should be downsized. This can reduce the influence of noise from the integrated circuit 210 that is exerted on the antenna 100.

Further, the discrete components 220 are disposed together in a single place without spreading out. Thus, when the discrete components 220 are inspected after the wireless module 1000 is assembled, the movement of an inspection device (not illustrated) such as a camera can be minimized, and also inspection time can be reduced.

Figure 7B:
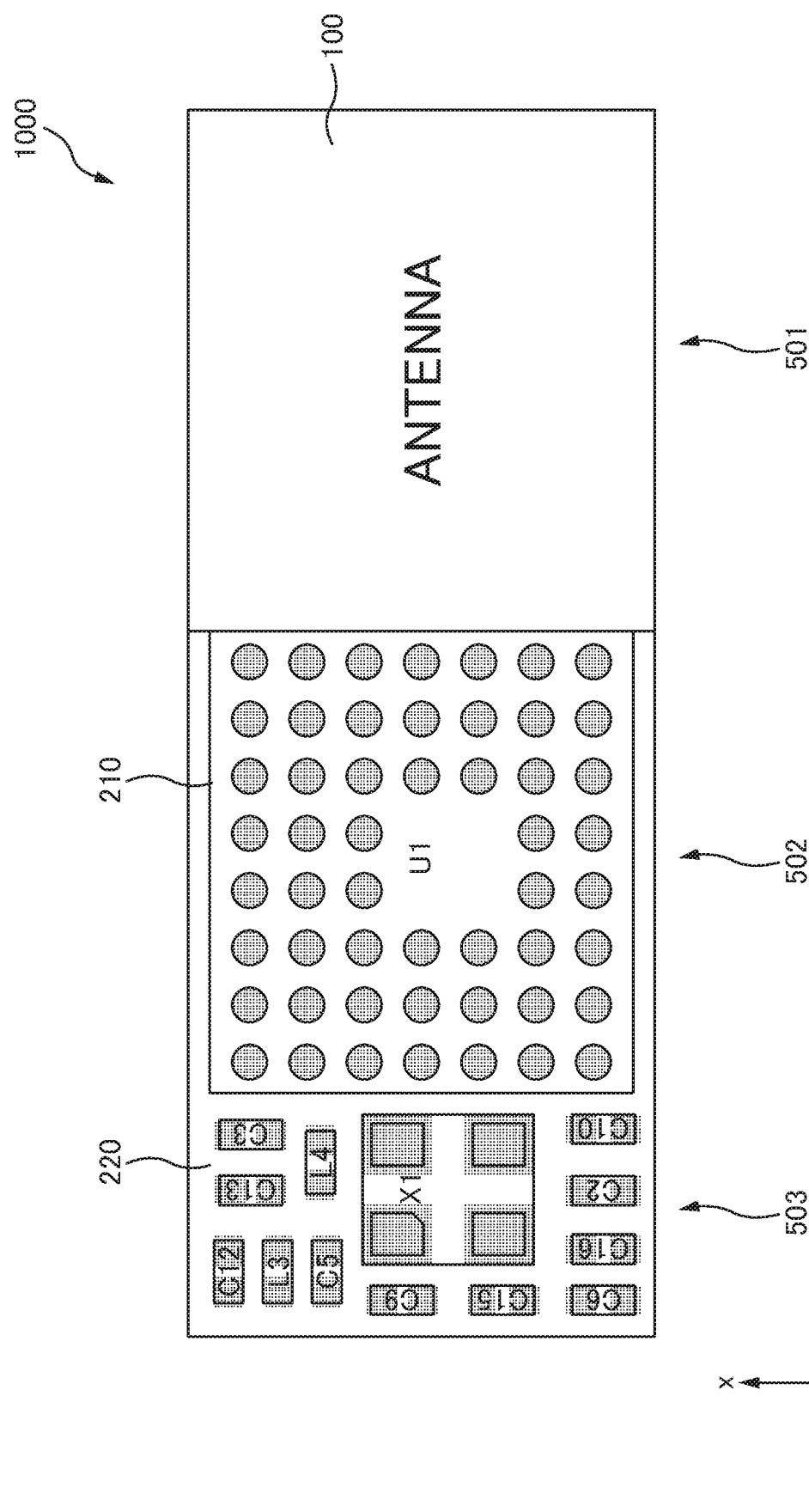
FIG. 7B is a diagram illustrating a wireless module according to an embodiment of the present disclosure.
Figure 7C:
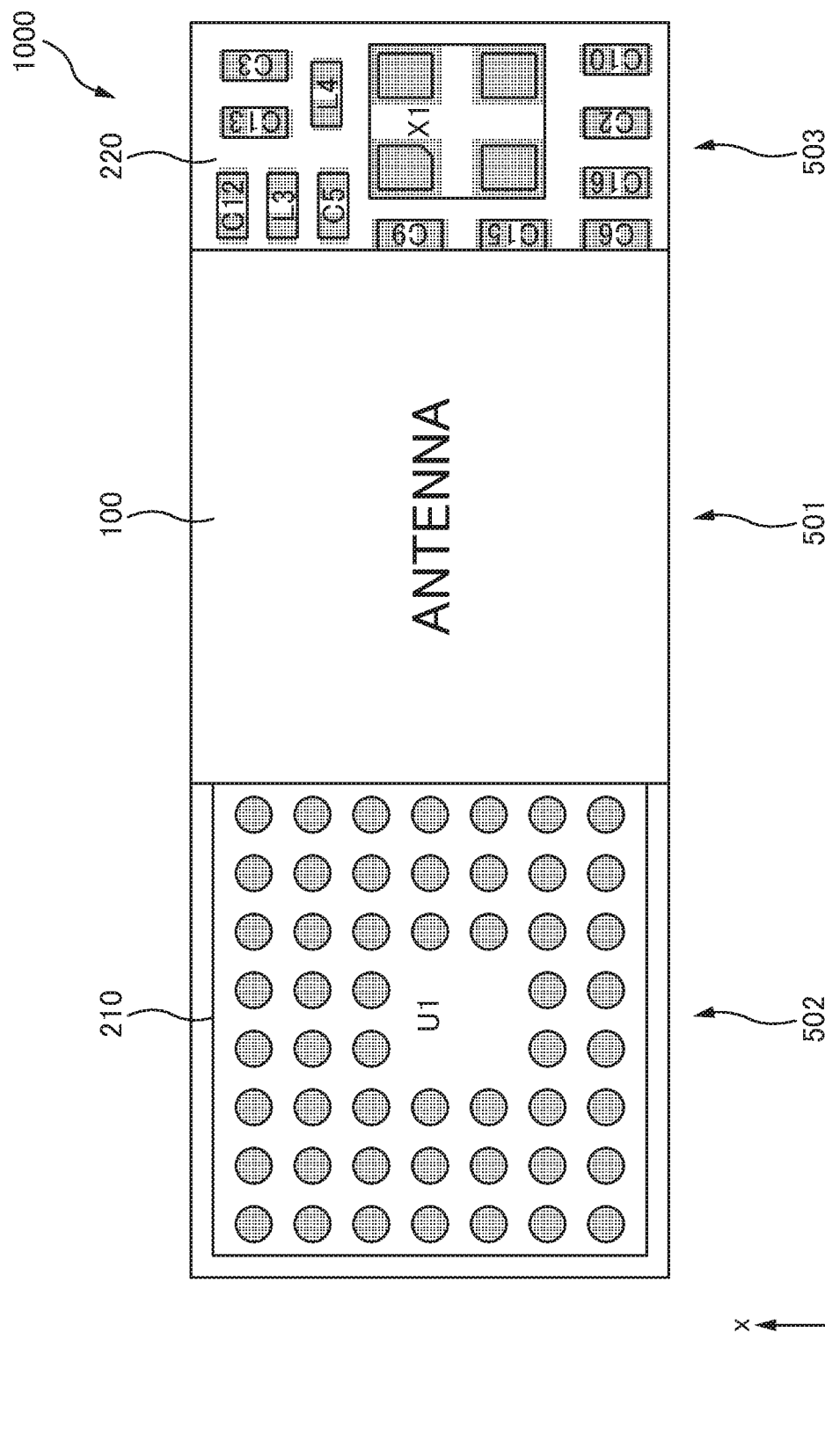
FIG. 7C is a diagram illustrating a wireless module according to an embodiment of the present disclosure.

The wireless modules 1000 illustrated in FIGS. 7B and 7C are examples in the case where all the discrete components 220 are collected either one of end portions of the wireless module 1000.

According to such embodiments as well, the discrete components 220 can be disposed together in a single place without spreading out. Thus, when the discrete components 220 are inspected after the wireless module 1000 is assembled, the movement of an inspection device (not illustrated) such as a camera can be minimized, and also inspection time can be reduced.

Figure 7D:
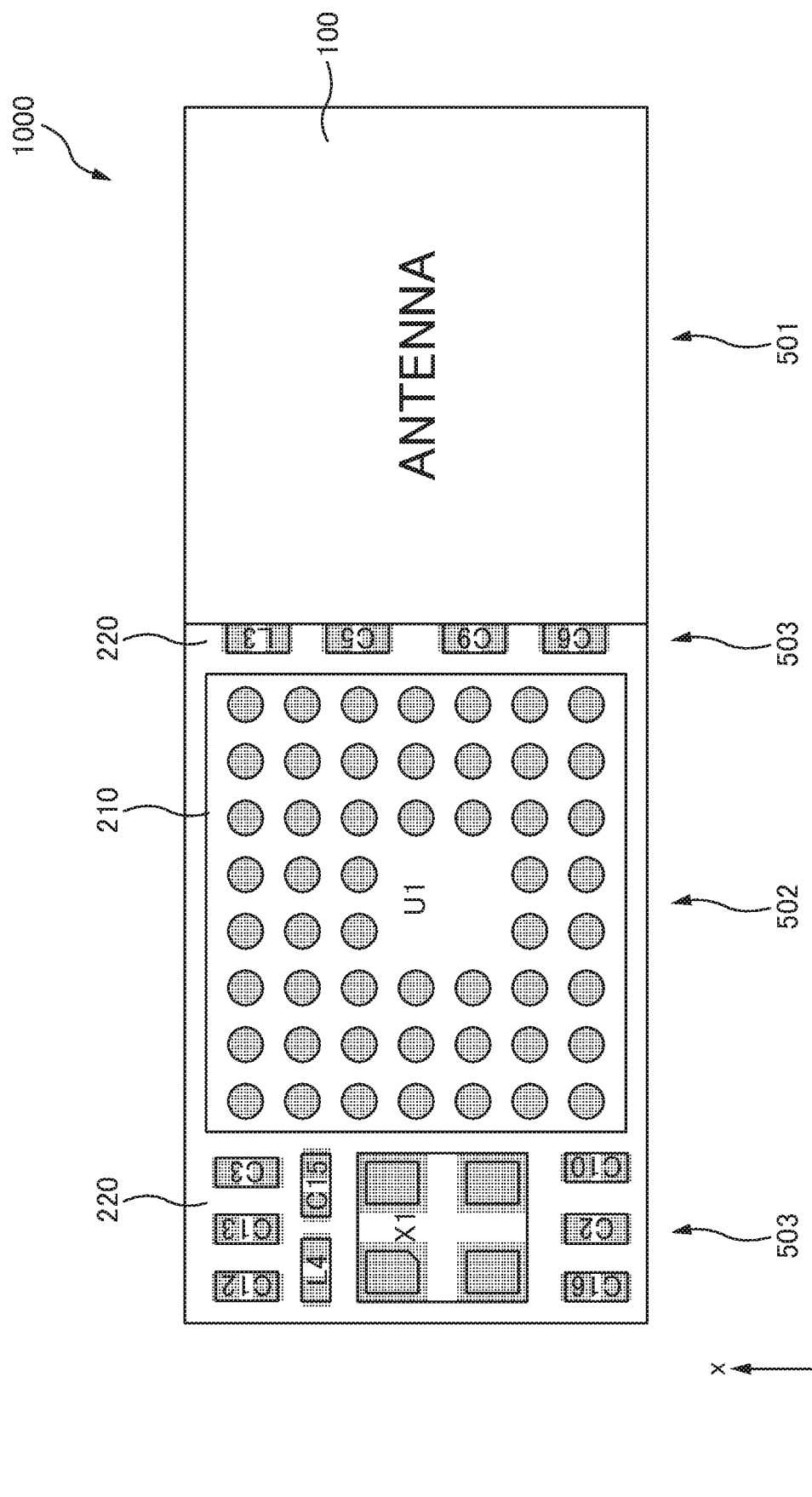
FIG. 7D is a diagram illustrating a wireless module according to an embodiment of the present disclosure.
Figure 7E:
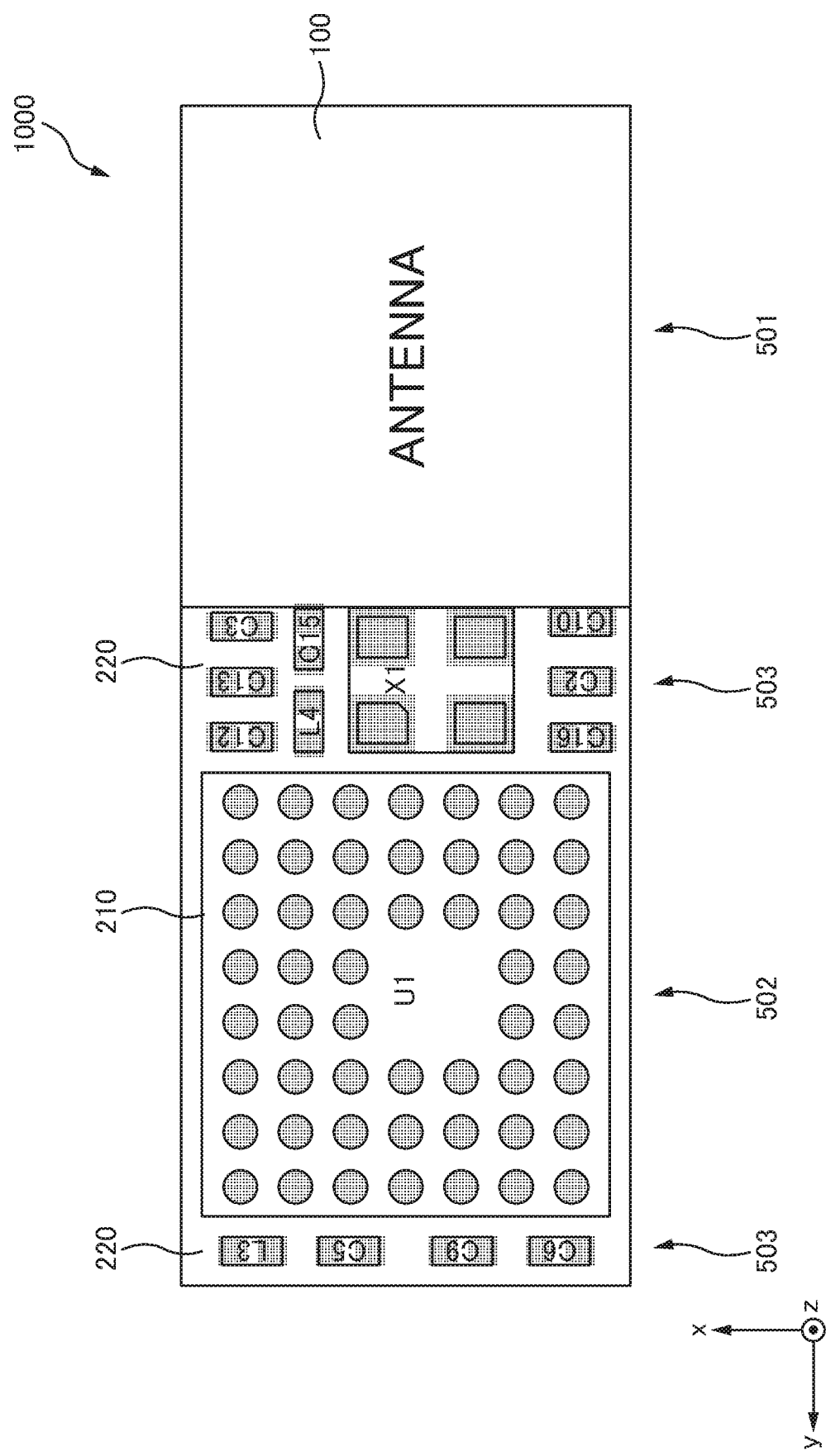
FIG. 7E is a diagram illustrating a wireless module according to an embodiment of the present disclosure.

The wireless modules 1000 illustrated in FIGS. 7D and 7E are examples in the case where a part of the discrete component region 503 is provided at a position sandwiched between the antenna region 501 and the integrated circuit region 502.

According to such embodiments as well, the antenna 100 and the integrated circuit 210 can be disposed so as to be positioned distant from each other. This can reduce the influence of noise from the integrated circuit 210 that is exerted on the antenna 100.

Particularly in this case, at least either one of an oscillator configured to supply a pulse signal to the integrated circuit 210 and a passive element configured to match the sensitivity of the antenna 100, is preferably provided in the discrete component region 503 provided at a position sandwiched between the antenna region 501 and the integrated circuit region 502. These oscillator and passive element are relatively larger in size than other discrete components 220 such as a chip capacitor. Thus, a distance between the antenna 100 and the integrated circuit 210 can be set such that the antenna 100 and the integrated circuit 210 are away from each other.

Figure 7F:
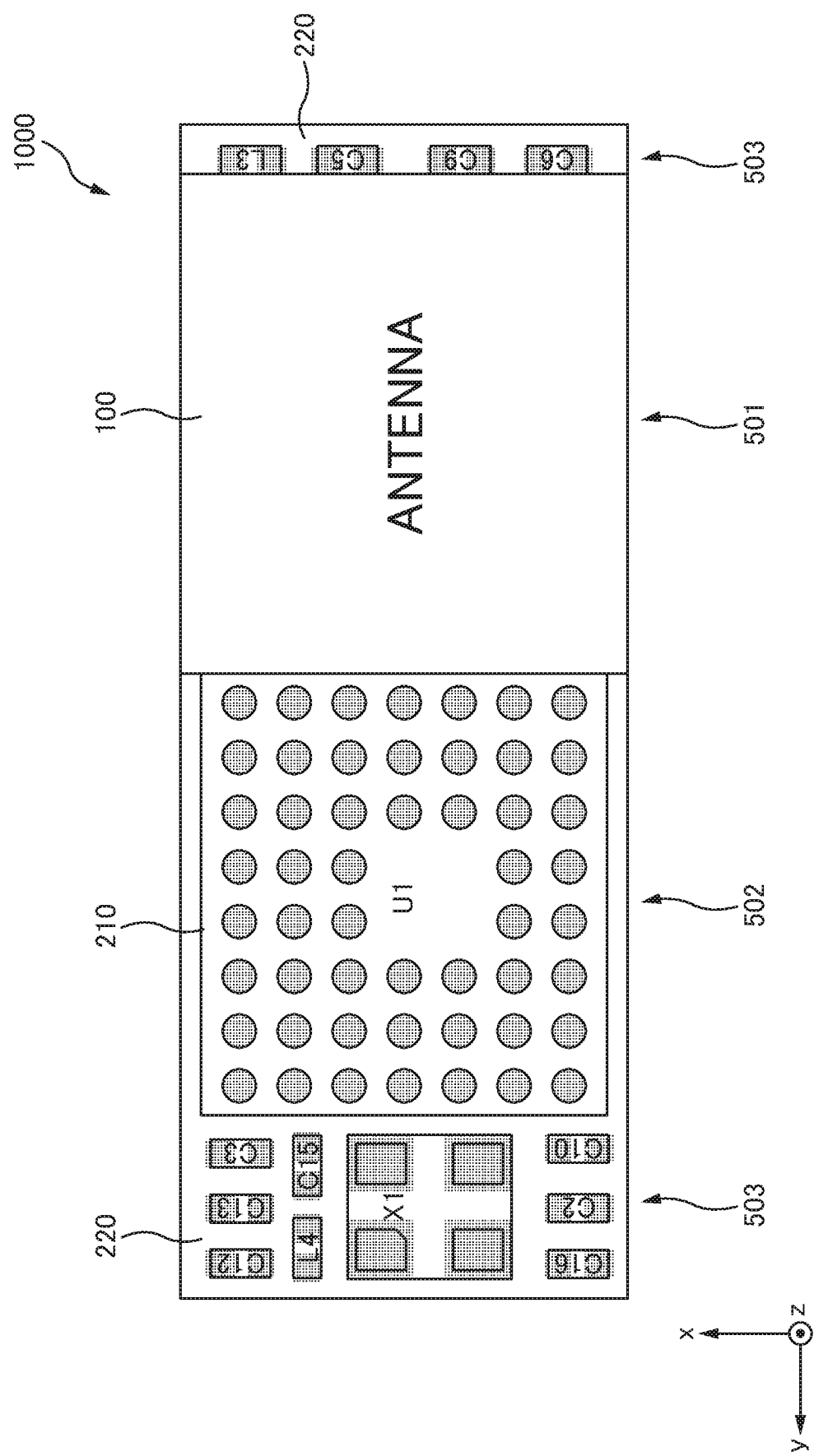
FIG. 7F is a diagram illustrating a wireless module according to an embodiment of the present disclosure.

In the wireless module 1000 illustrated in FIG. 7F, the discrete component region 503 is provided on both end portions of the wireless module 1000. Even if such an embodiment, however, the antenna 100 and the discrete components 220 can be provided so as to be aligned, in the longitudinal direction of the wireless module 1000, with the integrated circuit 210. Thus, the wireless module 1000 can be downsized.

Hereinabove, the wireless module 1000 and a method for manufacturing the wireless module 1000 according to embodiments of the present disclosure have been described. According to the wireless module 1000 and the method for manufacturing the wireless module 1000 of embodiments of the present disclosure, it becomes possible to further downsize the wireless module 1000 configured such that the antenna 100 and the electronic component 200 are mounted to the substrate 500.

In specific, as illustrated in FIGS. 7A, 7D, and 7E, the discrete components 220 are mounted in the discrete component region 503 provided at a position sandwiched between the antenna region 501 where the antenna 100 is provided and the integrated circuit region 502 where the integrated circuit 210 is provided. This can dispose the antenna 100 and the integrated circuit 210 so as to be positioned away from each other, thereby being able to reduce the influence of noise from the integrated circuit 210 affecting on the antenna 100.

Figure 8A:
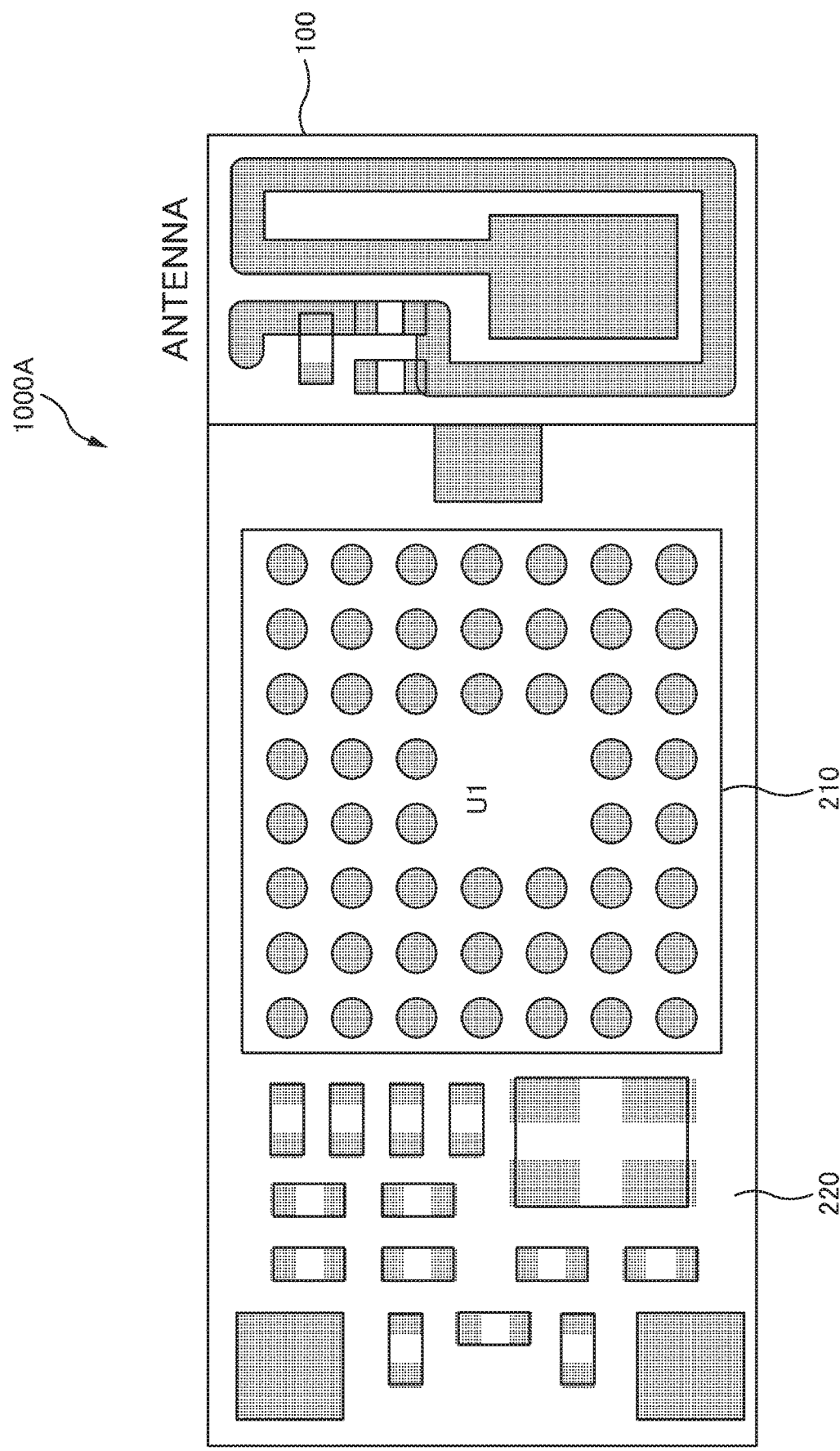
FIG. 8A is a diagram illustrating reception sensitivity of a wireless module according to an embodiment of the present disclosure.
Figure 8B:
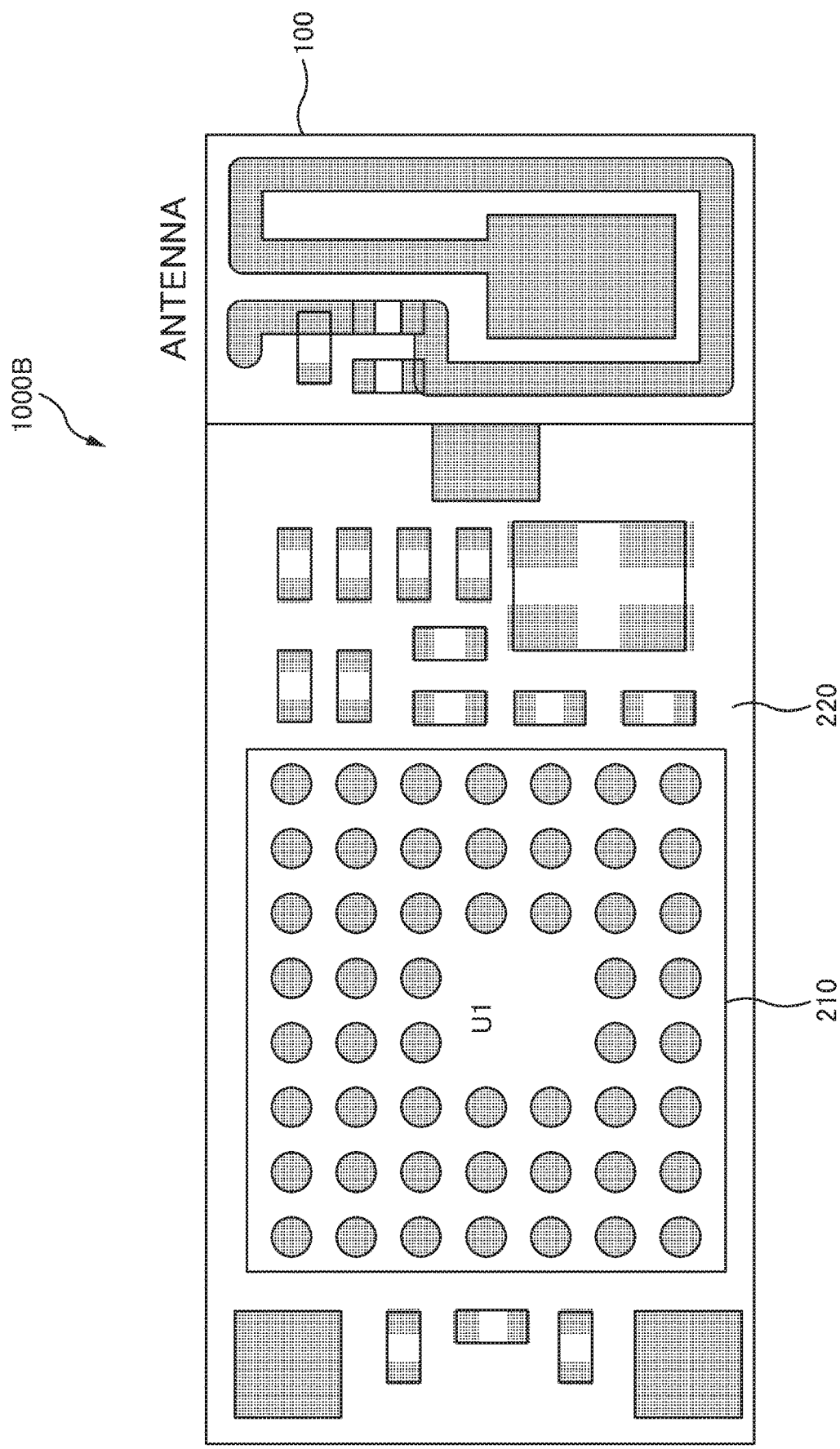
FIG. 8B is a diagram illustrating reception sensitivity of a wireless module according to an embodiment of the present disclosure.
Figure 8C:
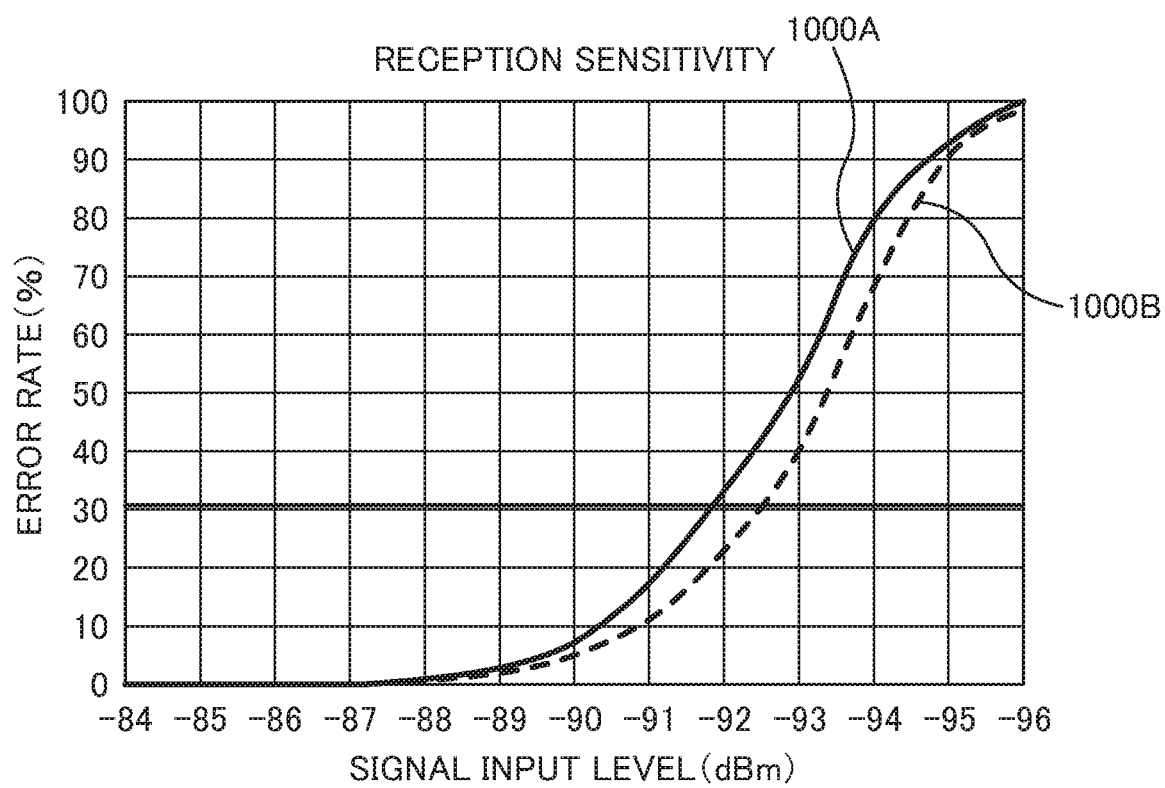
FIG. 8C is a diagram illustrating reception sensitivity of a wireless module according to an embodiment of the present disclosure.

As illustrated in FIGS. 8A to 8C, the reception sensitivity of the antenna 100 being enhanced by increasing the distance between the antenna 100 and the integrated circuit 210 such that they become distant from each other. In the wireless module 1000B illustrated in FIG. 8B, the antenna 100 is disposed to be more distant from the integrated circuit 210 than in the wireless module 1000A illustrated in FIG. 8A.

FIG. 8C shows the results of measurement of the radio wave reception sensitivity of the wireless modules 1000A, 1000B. FIG. 8C shows the results obtained by measuring error rates in the case of variously varying a signal input level of the wireless module 1000. Thus, this illustrates that the lower the error rate is, the higher the reception sensitivity is. As illustrated in FIG. 8C, it is confirmed that the wireless module 1000B has a lower error rate and higher reception sensitivity than the wireless module 1000A.

Note that the present disclosure is not limited to the wireless module 1000 according to embodiments of the present disclosure and the method for manufacturing the wireless module 1000. Materials, shapes, arrangements, and manufacturing procedures of the above described members are mere embodiments to execute the present disclosure, and may be variously be changed as long as not departing from the gist of the present disclosure.

Figure 9:
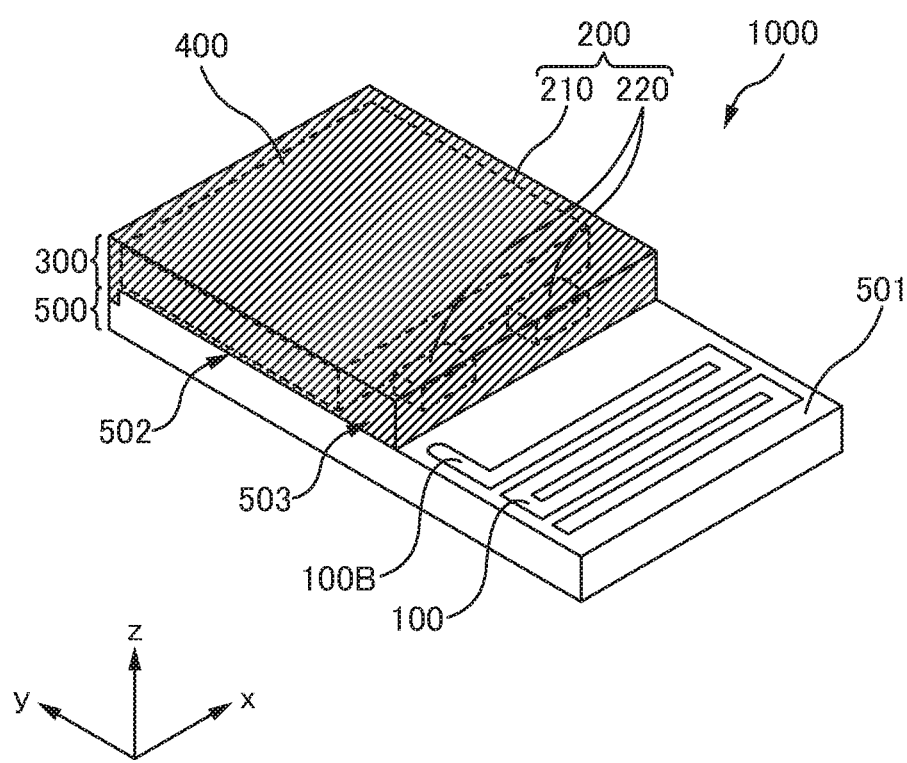
FIG. 9 is an external perspective view illustrating a wireless module according to an embodiment of the present disclosure.
Figure 10:
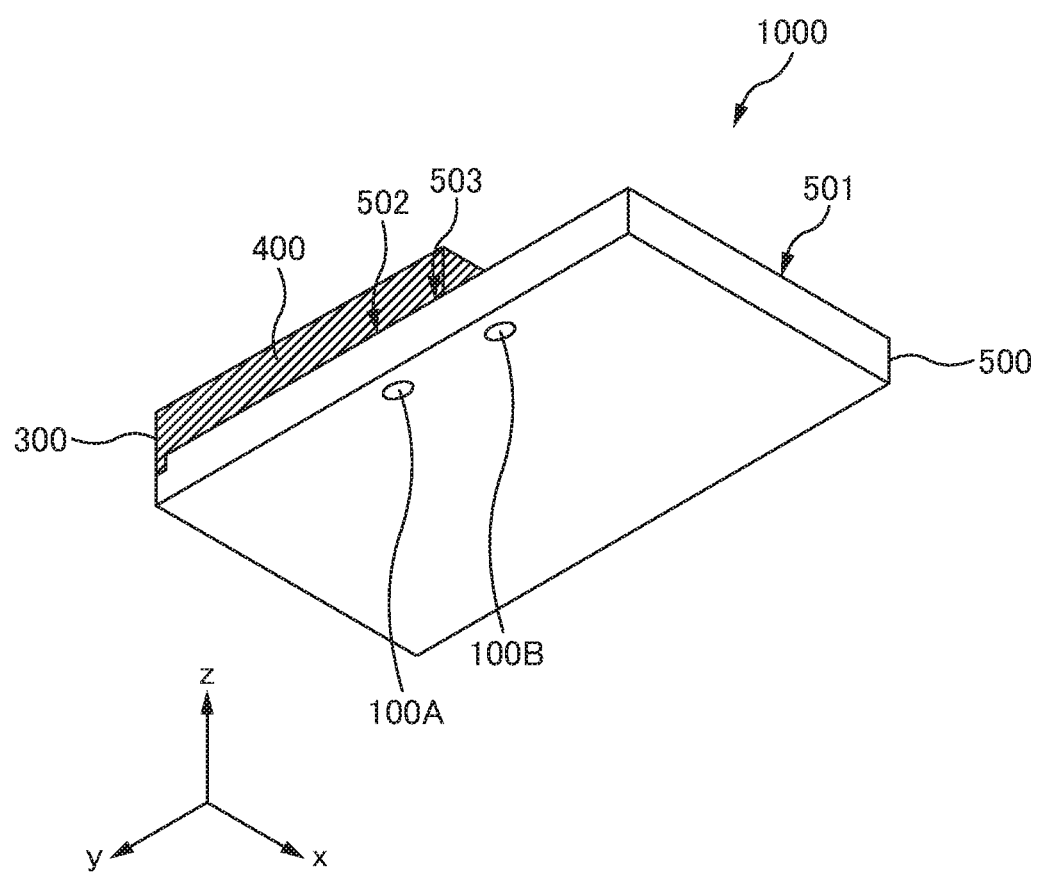
FIG. 10 is an external perspective view illustrating a wireless module according to an embodiment of the present disclosure.
Figure 11:
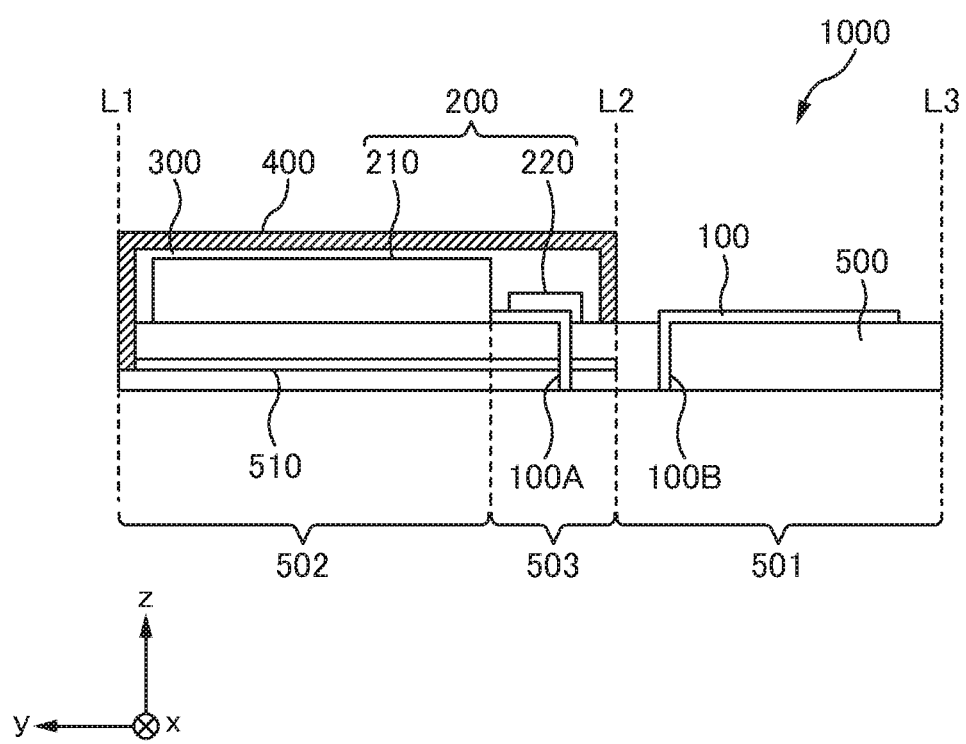
FIG. 11 is a cross-sectional view illustrating a wireless module according to an embodiment of the present disclosure.

For example, as illustrated in FIGS. 9 to 11, the antenna 100 may be formed on the front surface of the substrate 500. Then, in this case, it is more preferable to constitute the substrate 500 so as to include the first antenna connection portion (second conductive path) 100A and a second antenna connection portion (first conductive path) 100B that pass through the front surface and the back surface of the substrate 500. The first antenna connection portion 100A is connected to the integrated circuit 210 in the front surface of the substrate 500, while the second antenna connection portion 100B is connected to the antenna 100 in the front surface of the substrate 500.

In the first antenna connection portion 100A and the second antenna connection portion 100B, as illustrated in FIG. 10, respective end portions are exposed in the back surface of the substrate 500. Then, in the back surface of the substrate 500, when the first antenna connection portion 100A and the second antenna connection portion 100B are connected, the integrated circuit 210 and the antenna 100 are connected.

For example, if a circuit for connecting the first antenna connection portion 100A and the second antenna connection portion 100B is formed in a motherboard (not illustrated) of an electronic device, such as a wearable device, where the wireless module 1000 is to be mounted, a configuration can be made such that the integrated circuit 210 and the antenna 100 are connected when the wireless module 1000 is mounted to this motherboard.

With such an embodiment, such a thing becomes possible that a functional test on the wireless module 1000 is performed before the wireless module 1000 is mounted to the motherboard, for example, by inputting a wireless signal to the first antenna connection portion 100A in a simulated manner.

It is a matter of course that the integrated circuit 210 and the antenna 100 may be directly connected in the front surface of the substrate 500, without being connected in the back surface of the substrate 500 through the first antenna connection portion 100A and the second antenna connection portion 100B or through the motherboard not illustrated.

Further, the method for manufacturing the wireless module 1000 is not limited to the methods described above, but may be a method in a case where the order of processes is different or a method including a different process or an additional process. For example, in the removing process, when the resin layer 300 and the shielding layer 400 formed in the antenna region 501 is removed by a cutting process, not only the resin layer 300 may be completely removed from the surface of the substrate 500, but also the resin layer 300 may be left with a thin layer having a predetermined thickness.

Alternatively, the rectangular integrated circuit 210 may be in a shape of not only a rectangle but also a square.

Figure 12:
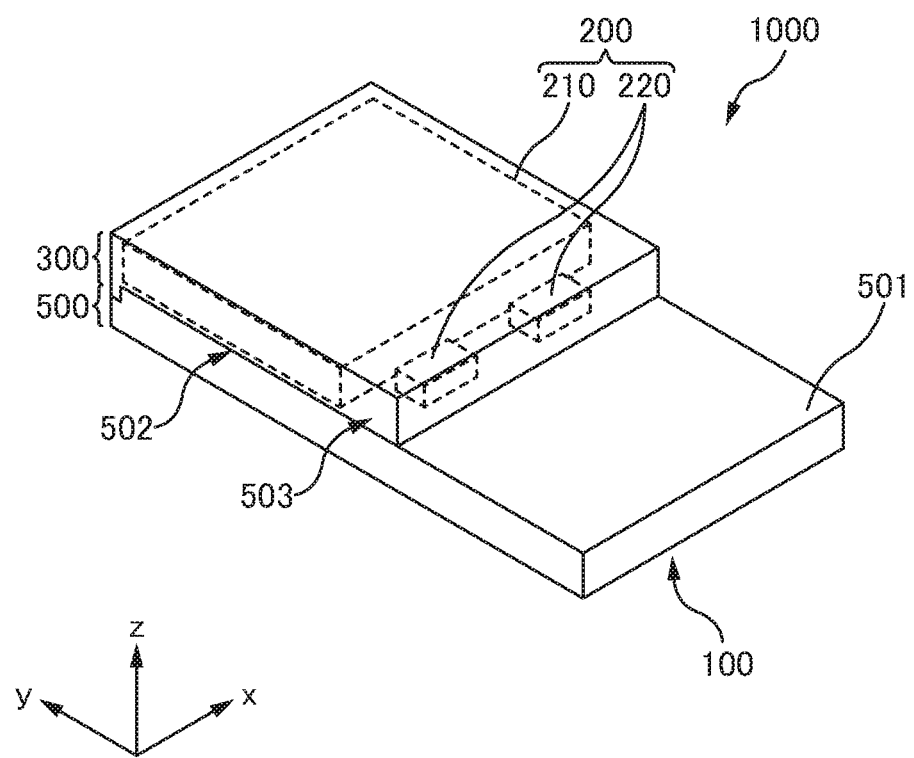
FIG. 12 is an external perspective view illustrating a wireless module according to an embodiment of the present disclosure.
Figure 13:
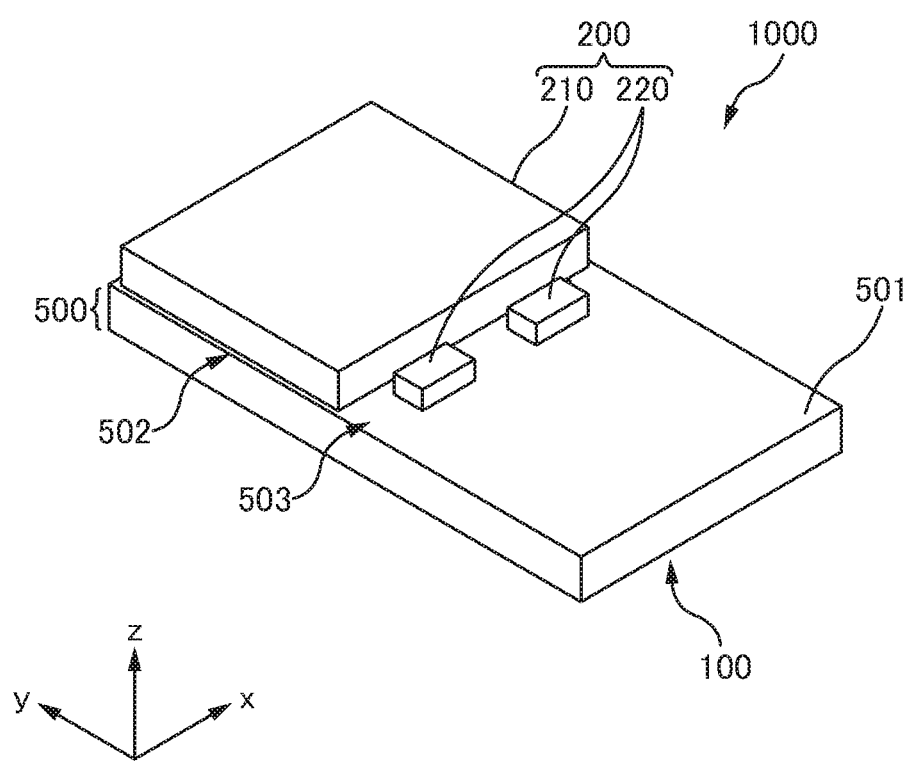
FIG. 13 is an external perspective view illustrating a wireless module according to an embodiment of the present disclosure.

Further, the wireless module 1000 may be configured without the shielding layer 400, as illustrated in FIG. 12. Further, the wireless module 1000 may be configured without either the resin layer 300 or the shielding layer 400, as illustrated in FIG. 13.

What is claimed is:

1. A wireless module comprising:
   a substrate having a rectangular shape;
   an antenna element provided in a first region of the substrate;
   an integrated circuit element having a rectangular shape mounted on a second region of the substrate, the integrated circuit element including an RF unit, a baseband unit, and a power supply unit, in a single package, the RF unit being configured to process an RF signal, the baseband unit being configured to process a baseband signal; and
   a plurality of discrete components mounted on a third region of the substrate via a solder, the solder for each discrete component laterally spreading beyond the discrete component in a plan view, the integrated circuit element being provided in the second region such that two parallel sides of the integrated circuit element are along long sides of the substrate, neither of the first region and the third region being provided between each of the two long sides of the substrate and each of the two sides of the integrated circuit element, the first region and the third region being provided along a longitudinal direction of the substrate with respect to the second region, wherein a discrete component closest to one of the long sides of the substrate, among the plurality of discrete components mounted on the third region of the substrate, is in the third region such that a distance between the discrete component and the one of the long sides of the substrate is equal to or greater than a distance between the one of the long sides of the substrate and one of the sides of the integrated circuit element closer to the one of the long sides of the substrate so as to provide for an extra margin for the solder that mounts said discrete component closest to the one of the long sides of the substrate to laterally spread without reaching and interfering with said one of the long sides of the substrate.

2. The wireless module according to claim 1, wherein at least a portion of the third region is provided to be sandwiched between the first region and the second region.

3. The wireless module according to claim 2, the discrete components include
   an oscillator configured to supply a pulse signal to the integrated circuit element, and
   a passive element configured to match sensitivity of the antenna element, and
at least either one of the oscillator and the passive element is provided in a region sandwiched between the first region and the second region, in the third region.

4. The wireless module according to claim 1, further comprising:
   a resin layer formed on the substrate, so as to seal the integrated circuit element and the discrete components; and
   a shielding layer formed on a surface of the resin layer, the shielding layer having conductivity.

5. The wireless module according to claim 1, wherein
the substrate includes a first conductive path and a second conductive path, the first and second conductive paths passing through one face and an other face of the substrate,
the antenna element is provided to the one face of the substrate and connected to the first conductive path in the one face,
the integrated circuit element is provided to the one face of the substrate and connected to the second conductive path in the one face, and
the integrated circuit element and the antenna element are connected by connecting the first conductive path and the second conductive path, in the other face of the substrate.

6. The wireless module according to claim 1, wherein
a distance between each of the long sides of the substrate and each of the sides of the integrated circuit element along the long sides of the substrate is equal to or greater than 0.1 mm and equal to or smaller than 0.5 mm.

7. The wireless module according to claim 1, wherein
a distance between each of the long sides of the substrate and each of the sides of the integrated circuit element along the long sides of the substrate is equal to or greater than 0.10 mm and equal to or smaller than 0.20 mm.

8. A method for manufacturing a wireless module, comprising:
   forming an antenna element in a first region of a substrate having a rectangular shape;
   mounting an integrated circuit element having a rectangular shape, on a second region aligned in a longitudinal direction of the substrate with respect to the first region, such that two parallel sides of the integrated circuit element are along long sides of the substrate, the integrated circuit element including an RF unit, a baseband unit, and a power supply unit, in a single package, the RF unit being configured to process an RF signal, the baseband unit being configured to process a baseband signal;
   mounting, via a solder, a plurality of discrete components on a third region aligned in the longitudinal direction of the substrate with respect to the first region and the second region, without providing the discrete components in a region between each of the two long sides of the substrate and each of the two sides of the integrated circuit element along the two long sides, the solder for each discrete component laterally spreading beyond the discrete component in a plan view; and
   cutting the substrate along the longitudinal direction,
   wherein a discrete component closest to one of the long sides of the substrate, among the plurality of discrete components mounted on the third region of the substrate, is in the third region such that a distance between the discrete component and the one of the long sides of the substrate is equal to or greater than a distance between the one of the long sides of the substrate and one of the sides of the integrated circuit element closer to the one of the long sides of the substrate so as to provide for an extra margin for the solder that mounts said discrete component closest to the one of the long sides of the substrate to laterally spread without reaching and interfering with said one of the long sides of the substrate.

* * * * *